(12) United States Patent
Wang et al.

(10) Patent No.: US 9,087,975 B2
(45) Date of Patent: Jul. 21, 2015

(54) RESISTIVE MEMORY ARRANGEMENT AND A METHOD OF FORMING THE SAME

(71) Applicant: Agency for Science, Technology and Research, Singapore (SG)

(72) Inventors: Xinpeng Wang, Singapore (SG); Xiang Li, Singapore (SG); Navab Singh, Singapore (SG); Guo-Qiang Patrick Lo, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 173 days.

(21) Appl. No.: 13/745,993

(22) Filed: Jan. 21, 2013

(65) Prior Publication Data

US 2013/0200327 A1 Aug. 8, 2013

(30) Foreign Application Priority Data

Jan. 20, 2012 (SG) ................. 201200484-2

(51) Int. Cl.
*H01L 45/00* (2006.01)
*H01L 27/24* (2006.01)
*B82Y 10/00* (2011.01)
*B82Y 40/00* (2011.01)

(52) U.S. Cl.
CPC ............ *H01L 45/04* (2013.01); *H01L 27/2409* (2013.01); *H01L 27/2454* (2013.01); *H01L 45/1226* (2013.01); *H01L 45/1253* (2013.01); *H01L 45/146* (2013.01); *H01L 45/16* (2013.01); *B82Y 10/00* (2013.01); *B82Y 40/00* (2013.01); *Y10S 977/762* (2013.01); *Y10S 977/943* (2013.01)

(58) Field of Classification Search
CPC ................ H01L 45/04; H01L 45/16
USPC .......... 257/2–5, E47.001–E47.005
See application file for complete search history.

(56) References Cited

U.S. PATENT DOCUMENTS

2009/0200536 A1* 8/2009 Van Schaijk et al. ............ 257/4
2010/0117041 A1 5/2010 Hwang et al.

OTHER PUBLICATIONS

Tian, et al., Coaxial Silicon Nanowires as Solar Cells and Nanoelectronic Power Sources, 449 Nature 885 (2007).
Sun, et al., Vertical-Si-Nanowire-Based Nonvolatile Memory Devices with Improved Performance and Reduced Process Complexity, 58 IEEE Transactions on Electron Devices 1329 (IEEE 2011).
Yang, et al., Vertical Silicon-Nanowire Formation and Gate-All-Around MOSFET, 29 IEEE Electron Device Letters 791 (IEEE 2008).

(Continued)

*Primary Examiner* — Cuong Q Nguyen
(74) *Attorney, Agent, or Firm* — K. David Crockett, Esq.; Niky Economy Syrengelas, Esq.; Crockett & Crockett, PC

(57) ABSTRACT

According to embodiments of the present invention, a resistive memory arrangement is provided. The resistive memory arrangement includes a nanowire, and a resistive memory cell including a resistive layer including a resistive changing material, wherein at least a section of the resistive layer is arranged covering at least a portion of a surface of the nanowire, and a conductive layer arranged on at least a part of the resistive layer. According to further embodiments of the present invention, a method of forming a resistive memory arrangement is also provided.

5 Claims, 10 Drawing Sheets

(56) References Cited

OTHER PUBLICATIONS

Baek, et al., Multi-Layer Cross-Point Binary Oxide Resistive Memory (OxRRAM) for Post-Nand Storage Application, Electron Devices Meeting, IEDM Technical Digest (IEEE 2005).

Lee, et al., 2-Stack 1D-1R Cross-Point Structure with Oxide Diodes as Switch Elements for High Density Resistance Ram Applications, Electron Devices Meeting, (IEEE 2007).

Yoon, et al., Vertical Cross-Point Resistance Change Memory for Ultra-High Density Non-Volatile Memory Applications, Symposium on VLSI Technology Digest of Technical Papers 26 (2009).

Tran, et al., A High-Yield HfOx-Based Unipolar Resistive RAM Employing Ni Electrode Compatible with Si-Diode Selector for Crossbar Integration, 32 IEEE Electronic Device Letters 396 (IEEE 2011).

* cited by examiner

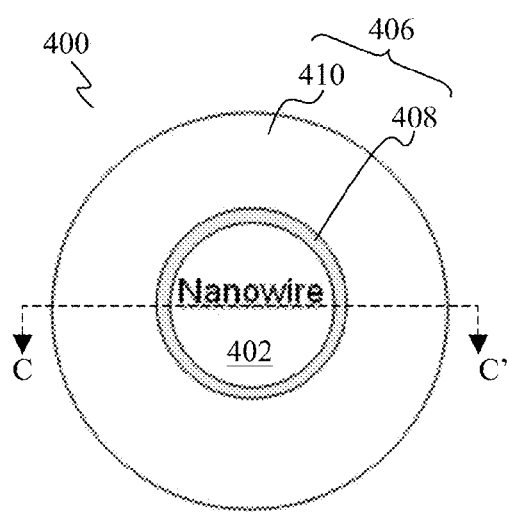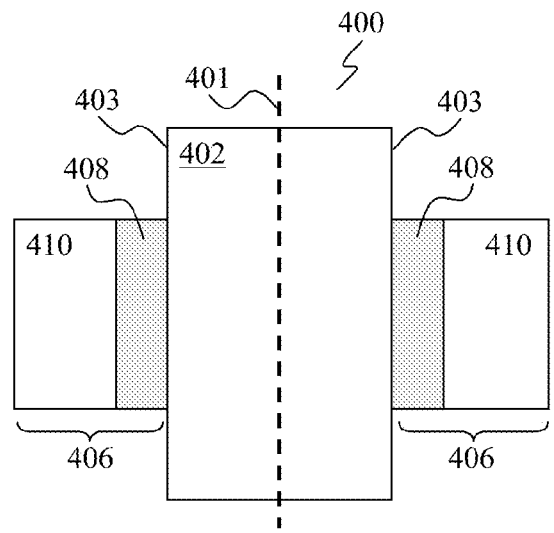
FIG. 4A              FIG. 4B
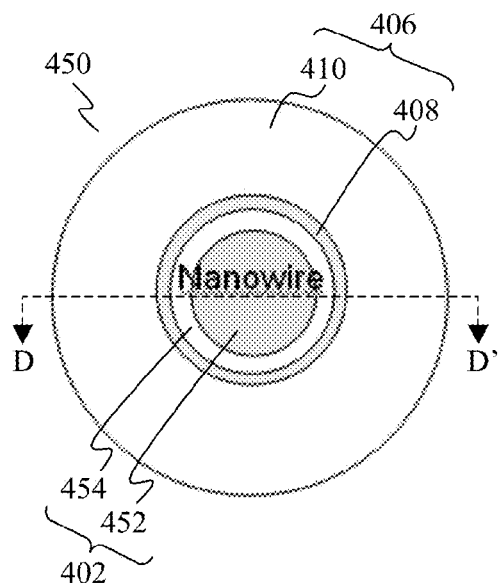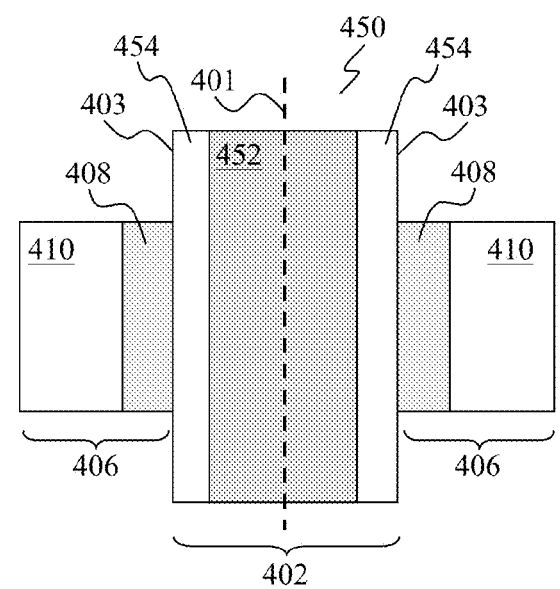
FIG. 4C              FIG. 4D from top    from bottom E-E' cross sectional view top view

US 9,087,975 B2

RESISTIVE MEMORY ARRANGEMENT AND A METHOD OF FORMING THE SAME

CROSS-REFERENCE TO RELATED APPLICATION

This application claims the benefit of priority of Singapore patent application No. 201200484-2, filed 20 Jan. 2012, the content of which is hereby incorporated by reference in its entirety for all purposes.

TECHNICAL FIELD

Various embodiments relate to a resistive memory arrangement and a method of forming the resistive memory arrangement.

BACKGROUND

As the physical limitation of scaling NAND flash memory is being reached in the near future, several classes of materials which demonstrate bi-stable resistances have been studied for high density non-volatile memory (NVM) applications for the next generation. Among them, transition-metal-oxide (TMO) based resistive random access memory (RRAM) cells attract lots of attention owing to their fast switching, excellent reliability (retention & endurance), good scalability and CMOS (complementary metal-oxide-semiconductor) compatibility. Therefore, RRAM is a promising candidate for high density NVM.

FIG. 1A shows a schematic perspective view of a generalized 2×2 array cross-bar memory structure 100, wherein one bit cell arrangement (e.g. as represented by the dotted rectangle 101) of the array 100 consists of a RRAM cell (1R) only, sandwiched between the conductive word lines (WL) and bit lines (BL). For example, the array 100 includes a RRAM 102a, of the bit cell 101, sandwiched between the bit line, $BL_n$, 104a and the word line, $WL_m$, 106a, and a RRAM 102b sandwiched between the bit line, $BL_{n+1}$, 104b and the word line, $WL_{m+1}$, 106b.

In order to eliminate the cross-talk interference from neighbouring RRAM cells in an array structure and to avoid the read error effect, a selector (or rectifying element), implemented either by 1D (diode) or by 1T (transistor), is required in each cell.

FIG. 1B shows a schematic of a generalized 3×3 array 1T-1R (a transistor and a RRAM cell) memory structure 110. For a 1T-1R memory configuration, each cell arrangement 111 includes a RRAM 112 electrically coupled with a transistor 113. The transistor 113 includes a first source/drain terminal 114, which may be electrically coupled to a terminal of the RRAM 112, a second source/drain terminal 115 and a gate terminal 116. As shown in FIG. 1B for the memory structure 110, as a non-limiting example, the one bit cell arrangement (e.g. as represented by the dotted circle 111a) includes the RRAM 112a electrically coupled to the transistor 113a, where the cell arrangement 111a is electrically coupled between the bit line, BL2, 117 and the source line, SL2, 118. The gate terminal of the transistor 113a is electrically coupled to the word line, WL2, 119.

FIG. 1C shows a schematic of a generalized 2×2 array 1D-1R memory structure 130 having a cross-bar architecture. For a 1D-1R memory configuration, each cell arrangement 131 includes a RRAM 132 electrically coupled with a diode selector 133. As shown in FIG. 1C, the 2×2 array memory structure 130 includes a first one bit cell arrangement 131a sandwiched between the bit line, $BL_n$, 136a and the word line, $WL_m$, 138a, a second one bit cell arrangement 131b sandwiched between the bit line, $BL_{n+1}$, 136b and the word line, $WL_m$, 138a, a third one bit cell arrangement 131c sandwiched between the bit line, $BL_n$, 136a and the word line, $WL_{m+1}$, 138b, and a fourth one bit cell arrangement 131d sandwiched between the bit line, $BL_{n+1}$, 136b and the word line, $WL_{m+1}$, 138b. As a non-limiting example, the third bit cell arrangement 131c includes the RRAM 132c electrically coupled to the diode 133c, where the diode 133c is arranged or formed over or on top of the RRAM 132c, vertically, between $BL_n$, 136a and $WL_{m+1}$ 138b. FIG. 1D shows a schematic top view of the 1D-1R memory structure 130 of FIG. 1C, illustrating a period or pitch of 2 F (F refers to the minimum feature size) between adjacent one bit cell arrangements (e.g. between the first one bit cell arrangement 131a and the third one bit cell arrangement 131c), thereby realizing a cell arrangement size of 4 $F^2$ footprint.

FIG. 1E shows a schematic cross sectional view of a 1D-1R memory cell arrangement 150. The memory cell arrangement 150 includes a stack arrangement of a p-doped layer (P-type) 151 and an n-doped layer (N-type) 152, which collectively form a diode 153, which may be equivalent to the diode 133 of FIG. 1C. The memory cell arrangement 150 further includes a top electrode (TE) 154, a resistive layer 155 and a bottom electrode (BE) 156, which collectively form a RRAM cell 157, which may be equivalent to the RRAM 132 of FIG. 1C.

Considering the fabrication technology for the traditional transistor, stacked 1T-1R (RRAM) structures for high density applications are not very suitable due to their high temperature processes, which make it difficult to form three-dimensional (3-D) multi-stacks, and large unit cell sizes, which is determined by the transistor.

Therefore, the vertical cross-bar architecture has attracted a lot of interest for high density 3-dimensional (3D) integration, with RRAM cells (and diodes) sandwiched between the word and bit lines, realizing a cell arrangement size of 4 $F^2$ (F refers to the minimum feature size) footprint, as illustrated in FIGS. 1C and 1D. Furthermore, the vertical 1D-1R cross-bar architecture may have a 4 $F^2/n$ footprint, where n is the number of stacked layers. Nevertheless, the requirements for the diode selector, including high forward current density, high on/off current ratio, low processing temperature and high CMOS compatibility, have been found to be very difficult to be met simultaneously in the vertical 1D-1R architecture. For example, the diode stack (material) is not CMOS friendly. Furthermore, the current (density or area) needs to be increased for the diode to meet the RRAM switching requirements. In addition, the current through the diode may not be big enough to trigger the RRAM switching with size scaling.

In addition, as illustrated in FIG. 1C, the RRAM (1R) (e.g. 132c) and the diode (1D) (e.g. 133c) are stacked vertically in between WL (e.g. 138b) and BL (e.g. 136a) in the conventional 1D-1R cross-bar architecture. Moreover, the critical dimensions for both the RRAM and the diode are exactly the same, which means that the size of the diode has to scale together with that of the RRAM cell. This means that as the size of the RRAM cell is increased or decreased, the size of the diode needs to correspondingly increase or decrease by the same amount.

SUMMARY

According to an embodiment, a resistive memory arrangement is provided. The resistive memory arrangement may include a nanowire, and a resistive memory cell including a resistive layer including a resistive changing material, wherein at least a section of the resistive layer is arranged covering at least a portion of a surface of the nanowire, and a conductive layer arranged on at least a part of the resistive layer.

According to an embodiment, a resistive memory arrangement is provided. The resistive memory arrangement may include a plurality of nanowires, and a plurality of resistive memory cells, wherein each resistive memory cell of the plurality of resistive memory cells includes a resistive layer including a resistive changing material, wherein at least a section of the resistive layer is arranged covering at least a portion of a surface of a respective nanowire of the plurality of nanowires, and a conductive layer arranged on at least a part of the resistive layer, and a plurality of conductive lines electrically coupled to the plurality of nanowires and the plurality of resistive memory cells.

According to an embodiment, a method of forming a resistive memory arrangement is provided. The method may include forming a nanowire, forming a resistive layer including a resistive changing material, wherein at least a section of the resistive layer is arranged covering at least a portion of a surface of the nanowire, and forming a conductive layer on at least a part of the resistive layer.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 4A shows a schematic top view of a resistive memory arrangement, according to various embodiments.

FIG. 4B shows a schematic cross sectional view of the resistive memory arrangement of the embodiment of FIG. 4A taken along the line C-C'.

FIG. 4C shows a schematic perspective view of a resistive memory arrangement, according to various embodiments.

FIG. 4D shows a schematic cross sectional view of the resistive memory arrangement of the embodiment of FIG. 4C taken along the line D-D'.

DETAILED DESCRIPTION

Figure 1A:
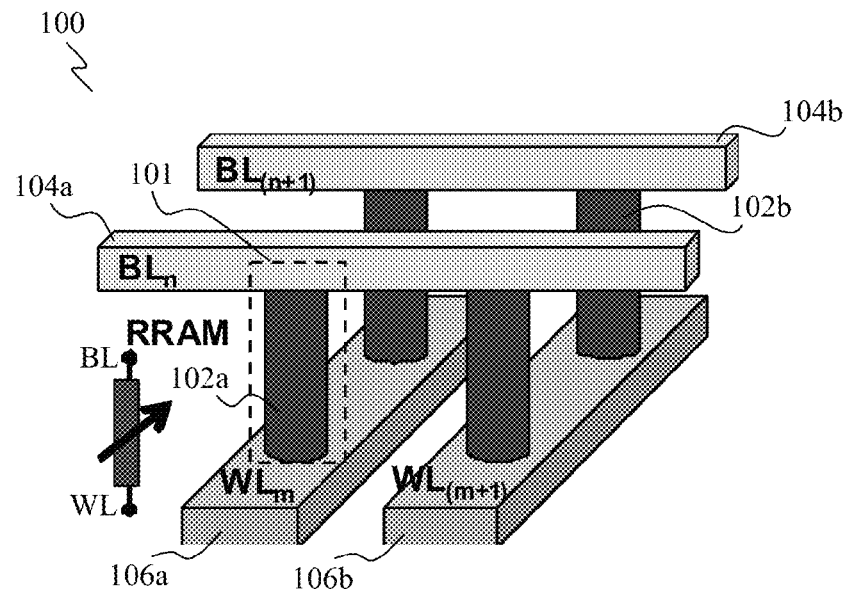
FIG. 1A shows a schematic perspective view of a generalized 2×2 array cross-bar memory structure.
Figure 1B:
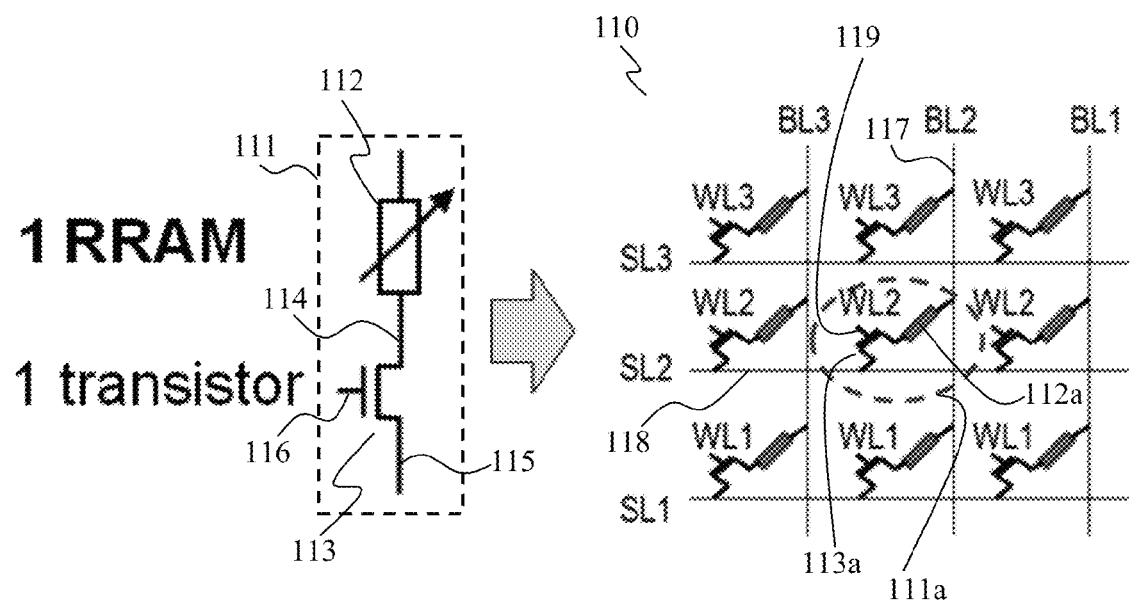
FIG. 1B shows a schematic of a generalized 3×3 array 1T-1R memory structure.
Figure 1C:
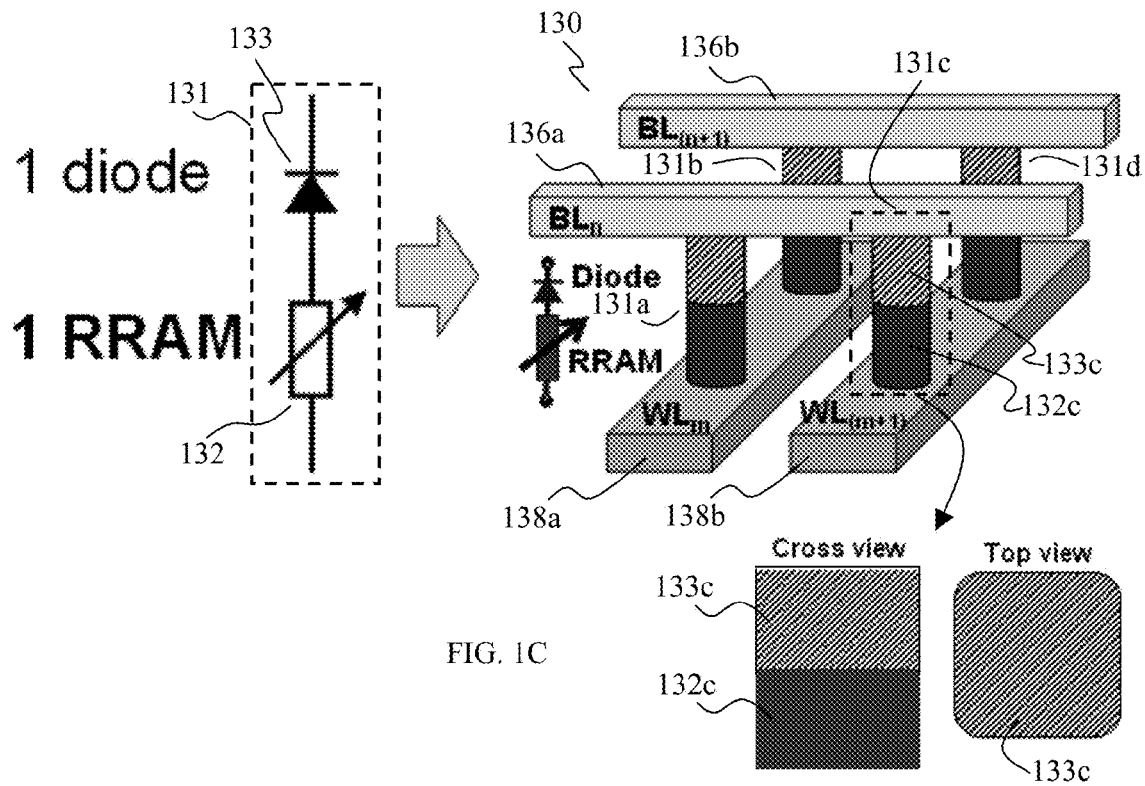
FIG. 1C shows a schematic of a generalized 2×2 array 1D-1R memory structure.
Figure 1D:
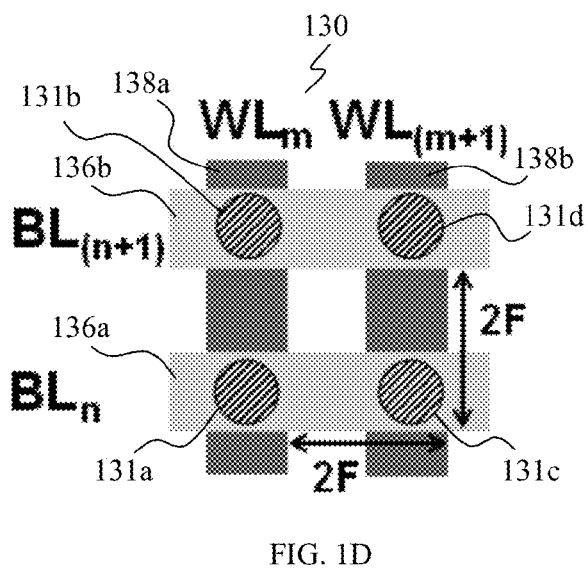
FIG. 1D shows a schematic top view of the 1D-1R memory structure of FIG. 1C.
Figure 1E:
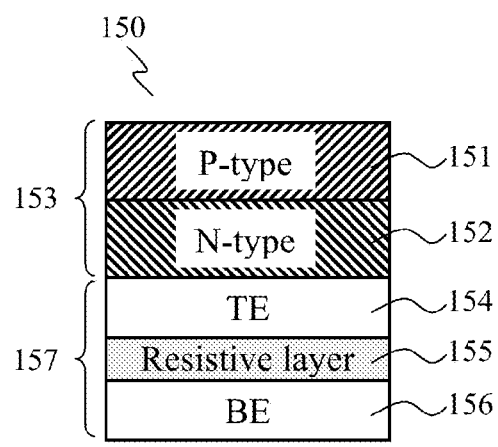
FIG. 1E shows a schematic cross sectional view of a 1D-1R memory cell arrangement.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

In the context of various embodiments, the term "about" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments relate to semiconductor memory devices and methods of fabricating such devices in high density.

Various embodiments provide resistive random access memory (RRAM) cells and/or arrangements for high density non-volatile memory (NVM) applications and methods of fabricating the RRAM cells and/or arrangements.

Various embodiments may provide resistive memory arrangements having a 1R(RRAM memory cell) architecture, a 1D (diode)+1R(RRAM memory cell) architecture or a 1T (transistor)+1R(RRAM memory cell) architecture. The selector (1D or 1T) may enable proper switching of the intended resistive memory cell to minimise or prevent read error effect. The 1D may be a nanowire-based diode and the 1T may be a nanowire-based transistor.

A RRAM cell may have a metal-insulator-metal (M-I-M) configuration. A diode may be formed of a pn junction. In various embodiments, one of the metal layers of the M-I-M structure may be a common layer to the RRAM cell and the diode, meaning that the common metal layer is part of the diode, as either the n-doped layer or the p-doped layer of the diode. In various embodiments, a separate pn junction of the diode may be provided to the M-I-M structure.

Various embodiments may provide nanoelectronic (Nano-E), non-volatile memory (NVM) based on the integration of phase change random access memory (PCRAM) and resistive random access memory (RRAM) cells with ultra scaled vertical silicon (Si) nanowire devices.

Various embodiments may provide a RRAM integration scheme, which integrates RRAM cells on top of vertical nanowires, for example a RRAM cell may be stacked on top of a vertical nanowire.

Various embodiments may provide a RRAM integration scheme (e.g. a lateral integration scheme), which integrates RRAM cells around vertical nanowires, with or without an extra selector (e.g. diode), depending on the switching properties of the RRAM stacks. This may mean that a RRAM cell may be formed surrounding a nanowire. The RRAM cell may extend laterally from the side or peripheral surface or circumference of the nanowire. Therefore, 1R (diode free) stack or arrangement may be formed surrounding a vertical nanowire, laterally integrated around the vertical nanowire.

An additional diode selector or extrinsic diode, when fabricated, may be formed adjacent to the nanowire and/or the RRAM cell, and may surround the nanowire and extend laterally from the side or circumference of the nanowire. Therefore, the RRAM cell may be formed over the diode, where both the RRAM cell and the diode extend laterally from the side or circumference of the nanowire, at least substantially perpendicular to a longitudinal axis of the nanowire. In other words, a 1D+1R stack or arrangement may be formed surrounding a vertical nanowire, laterally integrated around the vertical nanowire.

The RRAM cells and the resistive memory arrangements, including 1D+1R or 1R architectures, of various embodiments may be fully CMOS compatible. The RRAM cells and the resistive memory arrangements of various embodiments may be fabricated based on the 32 nm technology node and beyond.

The resistive memory arrangements of various embodiments may be employed for all non-volatile memory (NVM) application related areas, suitable for both stand-alone and embedded NVM applications, for example for data storage related applications, requiring density and endurance, e.g. for cell-phones, tablets, for code storage related applications, requiring density and scalability, e.g. for computers, cell-phones, and for embedded NVM related applications, requiring ease to embed, e.g. for microcontrollers, field-programmable gate arrays (FPGAs).

The resistive memory arrangements of various embodiments may have a 1D+1R or a 1R only configuration surrounding a nanowire, with a small footprint, down to 4 $F^2$ (F is the minimum feature size), thereby providing the highest density. This means that various embodiments may provide RRAM cell and vertical nanowire integration with a small footprint, down to 4 $F^2$, which may be desirable for high density NVM applications.

Different from the conventional vertical cross-bar architecture, the respective areas or sizes for the RRAM cell (1R) and/or the selector (e.g. diode, 1D), when present, in this integration scheme, may be controlled separately and flexibly, providing more space to reach the required drive current, $I_{SWITCH}$, for RRAM switching, so that the drive current required for reversible switching may be tuned and reached more easily. This means that there may be a balance of the current provided by 1D and the drive current required by 1R. In addition, various embodiments pave the way for integrating the RRAM stacks having vertical nanowires of various embodiments, with vertical nanowire CMOS devices, which is very desirable for embedded NVM applications.

Various embodiments may provide a memory unit cell or arrangement having a two-terminal RRAM cell, with or without an extra diode selector, In various embodiments, one or more memory unit cells may at least substantially surround a vertical nanowire, where the nanowire may be formed by a standard vertical top-down process.

In various embodiments, the materials for the nanowires may include but not limited to silicon (Si), germanium (Ge) or III-V semiconductors including one or more group III elements (e.g. aluminum (Al), gallium (Ga) or indium (In)) and one or more group V elements (e.g. nitrogen (N), arsenic (As) or antimony (Sb)), which may therefore enable the nanowire to serve as (1) a bottom electrode for the RRAM cells, or (2) one component of an additional diode selector, or (3) one contact electrically connected with an additional diode.

In various embodiments where the nanowire materials serve as the bottom electrode (BE) of the RRAM cell, a thin resistive layer having transition metal oxide(s), including but not limited to hafnium oxide ($HfO_2$), titanium oxide ($TiO_2$), aluminium oxide ($Al_2O_3$), tantalum oxide ($Ta_2O_5$), nickel oxide ($NiO_x$ tungsten oxide ($WO_x$), with or without dopants, may be deposited around the nanowire to serve as the switching dielectric. The resistive layer may be a single layer or have a multilayer structure consisted by one or more transition metal oxides, including the materials as described above.

Subsequently, a metal layer or a conductive layer of a material including but not limited to platinum (Pt), tungsten (W), nickel (Ni), aluminium (Al), titanium nitride (TiN), tantalum nitride (TaN), hafnium nitride (HfN), aluminium nitride (AlN), or tungsten nitride (WN) may be deposited and patterned to serve as the top electrode (TE) of the RRAM cell.

In various embodiments of a resistive memory arrangement having a RRAM cell (resistive memory cell) with an extra diode selector, the nanowire materials may serve as one component (e.g. first part) of the diode, with the other component (e.g. second part) of the diode, besides also serving as the bottom electrode of the RRAM cell, formed around the nanowire. The materials for the other component of the diode may include but not limited to highly doped Si, Ge, and III-V semiconductors, or their alloys, including but not limited to nickel silicide (NiSi), titanium silicide (TiSi$_2$), cobalt silicide (CoSi$_2$), nickel-platinum silicide (NiPtSi), nickel germanide (NiGe) and nickel-germanosilicide (NiGeSi). Subsequently, a thin resistive layer as described above, followed by a metal layer as described above may be deposited and patterned to form 1D+1R memory unit cells.

In various embodiments, the silicide material may be formed, for example by depositing a metal layer on a silicon (Si) nanowire, which are then subjected to a heat treatment, for example using a rapid thermal annealing process, in order to form a metal silicide.

In various embodiments of a resistive memory arrangement having a RRAM cell (resistive memory cell) with an extra diode selector, the nanowire materials may serve as a contact electrically connected with the diode, which may be formed around the nanowires. Subsequently, a thin resistive layer as described above, followed by a metal layer as described above may be directly deposited and patterned to form 1D+1R memory unit cell arrangements. Optionally, another metal layer or conductive layer may be first formed before the deposition of the resistive layer and the metal layer as described above.

In various embodiments, the respective sizes or dimensions for the RRAM cell and the diode selector, when present, may be controlled separately and flexibly by tuning or changing the nanowire dimension (e.g. length), and/or the contact area of the top electrode (e.g. conductive layer) and/or the diode around the nanowire.

In various embodiments, any one or each RRAM cell may have two switching modes, which is either unipolar or bipolar.

Figure 2A:
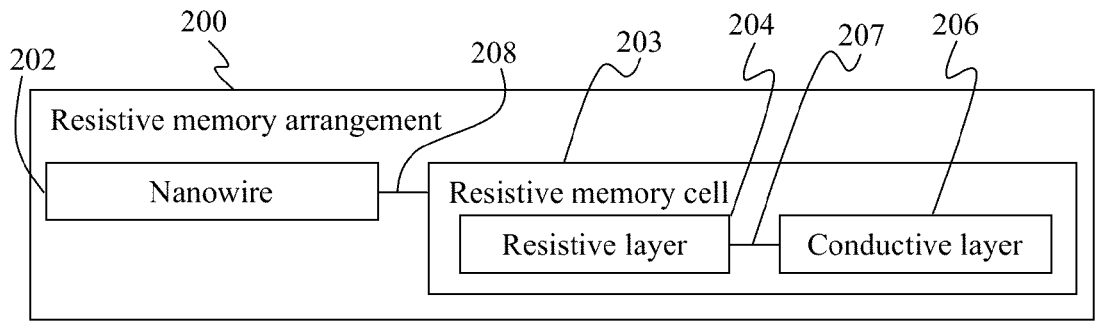
FIG. 2A shows a schematic block diagram of a resistive memory arrangement, according to various embodiments.

FIG. 2A shows a schematic block diagram of a resistive memory arrangement 200, according to various embodiments. The resistive memory arrangement 200 includes a nanowire 202, and a resistive memory cell 203 including a resistive layer 204 including a resistive changing material, wherein at least a section of the resistive layer 204 is arranged covering at least a portion of a surface of the nanowire 202, and a conductive layer (e.g. an electrode) 206 arranged on at least a part of the resistive layer 204. In FIG. 2A, the line represented as 207 is illustrated to show the relationship between the resistive layer 204 and the conductive layer 206, which may include electrical coupling and/or mechanical coupling, and the line represented as 208 is illustrated to show the relationship between the nanowire 202 and the resistive memory cell 203, which may include electrical coupling and/or mechanical coupling.

In various embodiments, the nanowire 202 may be part of the resistive memory cell 203.

In the context of various embodiments, the term "resistive memory cell" may include a memory cell of any kind which may be switched between two or more states exhibiting different resistivity values.

In the context of various embodiments, the resistive changing material may change its resistance as a result of a change in its resistivity.

In the context of various embodiments, the term "covering" may include embodiments where the section of the resistive layer 204 may be arranged directly on or over the portion of the surface of the nanowire 202 for covering the portion of the surface, and/or may be arranged with intervening layer(s) in between the section of the resistive layer 204 and the portion of the surface of the nanowire 202.

In various embodiments, the nanowire 202 may have a longitudinal axis, and wherein the surface of the nanowire 202 may be arranged at least substantially parallel to a plane which intersects the longitudinal axis. The surface may for example be an end surface, e.g. a top end surface. Therefore, the section of the resistive layer 204 may cover an end surface of the nanowire 204.

In various embodiments, the entire resistive layer 204 may be arranged on the surface of the nanowire 202 which is arranged at least substantially parallel to a plane which intersects the longitudinal axis. Therefore, the resistive layer 204 may be stacked on top of the nanowire 204. In this context, the resistive layer 204 may have a height of between about 0.1 nm and about 2 µm, for example between about 0.1 nm and about 1.5 µm, between about 0.1 nm and about 1 µm, between about 0.1 nm and about 500 nm, between about 0.1 nm and about 100 nm, between about 0.1 nm and about 10 nm, between about 10 nm and about 1 µm, between about 10 nm and about 100 nm or between about 100 nm and about 1 µm. It should be appreciated that the height for the resistive layer 204 may be flexible.

In various embodiments, the nanowire 202 may have a longitudinal axis, and wherein at least a portion of the resistive layer 204 (e.g. a portion of the section of the resistive layer 204) may be arranged around the longitudinal axis and at least substantially surrounding the nanowire 202. In other words, the resistive memory arrangement 200 may include a nanowire 202. The resistive memory arrangement 200 further includes a resistive memory cell (e.g. RRAM cell) 203, a portion of which may at least substantially surround the nanowire 202, where at least a portion of the resistive layer 204 may be arranged around the longitudinal axis and at least substantially surrounding the nanowire 202. In various embodiments, a portion of the resistive layer 204 may at least substantially surround the nanowire 202 throughout the entire length of the nanowire 202. In various embodiments, the resistive layer 204 may cover an end (e.g. top end) of the nanowire 202.

In various embodiments, by forming or providing at least a portion of the resistive layer 204 arranged around the longitudinal axis and at least substantially surrounding the nanowire 202, such a configuration is similar to a gate all around (GAA) nanowire architecture. Here, the resistive layer 204 or at least the portion of the resistive layer 204 arranged at least substantially surrounding the nanowire 202 may be referred to as a "gate" in terms of the GAA architecture.

In the context of various embodiments, the term "surround" may mean "encircle" and/or may mean an arrangement completely around a circumference or a perimeter of a structure (e.g. nanowire 202).

In various embodiments, the conductive layer 206 may be arranged confined within a boundary or height of the resistive layer 204.

In various embodiments, at least a portion of the conductive layer 206 may be arranged at least substantially surrounding the portion of the resistive layer 204 which at least substantially surrounds the nanowire 202. This means that at least a portion of the conductive layer 206 may at least substantially surround the nanowire 202. Here, the conductive layer 206 or at least the portion of the conductive layer 206 arranged at least substantially surrounding the portion of the resistive layer 204 around the nanowire 202 may also be referred to as a "gate" in terms of the GAA architecture.

In various embodiments, the portion of the resistive layer 204 may be arranged at least substantially surrounding a partial portion of the nanowire 202. This means that the resistive layer 204 or the portion of the resistive layer 204 may not necessary surround the nanowire 202 throughout the entire length of the nanowire 202.

In various embodiments, the resistive layer 204 and the conductive layer 206 may be arranged at least substantially coplanar relative to each other. This may mean that at least one respective surface (e.g. a top surface and/or a bottom surface) of the resistive layer 204 and the conductive layer 206 may be arranged in the same plane or flushed with each other.

In various embodiments, the resistive memory arrangement 200 may exhibit a self-rectifying effect or behaviour. This may mean that the resistive memory arrangement 200 may behave as a diode, thereby providing an intrinsic diode. In various embodiments, the resistive layer 204 and the conductive layer 206 may define an intrinsic diode. In various embodiments, the resistive layer 204 and the nanowire 202 may define an intrinsic diode. This may mean that a separate diode or rectifying element may not be necessarily provided for the resistive memory arrangement 200.

In the context of various embodiments, the nanowire 202 may serve as a conducting channel.

In the context of various embodiments, the resistive memory arrangement 200 may further include a substrate from which the nanowire 202 may extend monolithically. This means that the substrate and the nanowire 202 may be a monolithic (single) structure. The nanowire 202 may extend continuously from the substrate. The nanowire 202 may extend at least substantially perpendicular to a surface of the substrate. As a non-limiting example, a substrate may be provided and portions of the substrate may be removed, for example based on patterning and etching, so as to form a nanowire monolithically integrated with the substrate.

In various embodiments, the nanowire 202 may be doped.

In the context of various embodiments, the nanowire 202 may include a semiconductor material, including but not limited to silicon (Si), germanium (Ge) and a III-V semiconductor. The III-V semiconductor may include one or more group III elements (e.g. aluminum (Al), gallium (Ga) or indium (In)) and one or more group V elements (e.g. nitrogen (N), arsenic (As) or antimony (Sb)).

In the context of various embodiments, the nanowire 202 may include silicon. As non-limiting examples, the nanowire 202 may include a silicon nanowire, a polysilicon nanowire (i.e. polycrystalline silicon nanowire) and a silicon-germanium nanowire. However, it should be appreciated that any silicon-based nanowires may be provided.

In various embodiments, the resistive layer 204 may be a single layer or may include a multilayer arrangement.

In the context of various embodiments, the resistive changing material may include a transition metal oxide, including but not limited to hafnium oxide ($HfO_2$), titanium oxide ($TiO_2$), aluminium oxide ($Al_2O_3$), tantalum oxide ($Ta_2O_5$), nickel oxide ($NiO_x$) tungsten oxide ($WO_x$) or any combination thereof.

In the context of various embodiments, the resistive changing material may include a dopant (i.e. doped), for example including but not limited to germanium (Ge), tellurium (Te), antimony (Sb), silver (Ag), indium (In), chromium (Cr), nitrogen (N), selenium (Se), tin (Sn), silicon (Si), bismuth (Bi) or any combination thereof.

In the context of various embodiments, the conductive layer 206 may include a metal, for example including but not limited to platinum (Pt), tungsten (W), nickel (Ni), aluminum (Al), a nitride alloy or any combination thereof. The nitride alloy may include but not limited to titanium nitride (TiN), tantalum nitride (TaN), hafnium nitride (HfN), aluminum nitride (AlN), tungsten nitride (WN) or any combination thereof.

In the context of various embodiments, the nanowire 202 may have a diameter or a cross sectional dimension of between about 10 nm and about 200 nm, for example between about 10 nm and about 100 nm, between about 10 nm and about 50 nm or between about 50 nm and about 200 nm. The term "cross sectional dimension" may mean a dimension of a cross section of the nanowire 202 defined along a transverse axis (perpendicular to the longitudinal axis) of nanowire 202.

In the context of various embodiments, the nanowire 202 may have a length of between about 100 nm and about 2 μm, between about 100 nm and about 1 μm, between about 100 nm and about 500 nm, or between about 500 nm and about 2 μm.

In the context of various embodiments, the portion of the resistive layer 204 arranged around the longitudinal axis and at least substantially surrounding the nanowire 202 may have a height of between about 0.1 nm and about 2 μm, for example between about 0.1 nm and about 1.5 μm, between about 0.1 nm and about 1 μm, between about 0.1 nm and about 500 nm, between about 0.1 nm and about 100 nm, between about 0.1 nm and about 10 nm, between about 10 nm and about 1 μm, between about 10 nm and about 100 nm or between about 100 nm and about 1 μm. It should be appreciated that the height for the portion of the resistive layer 204 at least substantially surrounding the nanowire 202 may be flexible. In various embodiments, the resistive layer 204 or a portion thereof may fully cover the nanowire 202, e.g. equal to the length of the nanowire 202. This may mean that where the nanowire 202 extends from a substrate, the resistive layer 204 or a portion thereof may contact the substrate directly. In various embodiments, the resistive layer 204 or a portion thereof may be arranged towards a top portion of the nanowire 202, for example with a layer height of about 0.1 nm.

In the context of various embodiments, the resistive layer 204 may have a thickness of between about 3 nm and about 15 nm, for example between about 3 nm and about 10 nm, between about 3 nm and about 5 nm or between about 5 nm and about 15 nm. The resistive layer 204 may be a single layer or may have a multilayer structure, e.g. bi-layer or tri-layer or more, where the multilayer structure of the resistive layer 204 may have a total thickness as described above.

In the context of various embodiments, the conductive layer 206 may have a height of between about 0.1 nm and about 2 μm, for example between about 0.1 nm and about 1.5 μm, between about 0.1 nm and about 1 μm, between about 0.1 nm and about 500 nm, between about 0.1 nm and about 100 nm, between about 0.1 nm and about 10 nm, between about 10 nm and about 1 μm, between about 10 nm and about 100 nm or between about 100 nm and about 1 μm. It should be appreciated that the height for the conductive layer 206 may be flexible. In various embodiments, the height of the conductive layer 206 or a portion thereof may correspond to or at least substantially similar to the height of the resistive layer 204 or a portion thereof that at least substantially surrounds the nanowire 202.

In the context of various embodiments, the conductive layer 206 may have a thickness of between about 10 nm and about 50 nm, for example between about 10 nm and about 30 nm, between about 10 nm and about 20 nm or between about 30 nm and about 50 nm The conductive layer 206 may be a single layer or may have a multilayer structure, e.g. bi-layer or tri-layer or more, where the multilayer structure of the conductive layer 206 may have a total thickness as described above.

In the context of various embodiments, the term "nanowire" may mean a nanostructure extending, for example in a longitudinal direction, with dimensions in the order of nanometers, and may be used interchangeably with the terms "nanorod", "nanopillar", "nanocolumn", "nanotube" and the likes.

In various embodiments, the nanowire 202 may include a core portion and a peripheral portion at least substantially surrounding the core portion, wherein the core portion may be doped with doping atoms of a first conductivity type, wherein the peripheral portion may be doped with doping atoms of a second conductivity type, and wherein the second conductivity type is different from the first conductivity type.

In the context of various embodiments, the core portion may have a diameter or a cross sectional dimension of between about 5 nm and about 100 nm, for example between about 5 nm and about 50 nm, between about 5 nm and about 20 nm, between about 20 nm and about 100 nm, or between about 50 nm and about 100 nm.

In the context of various embodiments, the doping atoms of the first conductivity type/the second conductivity type may be of a p-conductivity type such that a material doped with such doping atoms may be p-doped while the doping atoms of the second conductivity type/the first conductivity type are of an n-conductivity type such that a material doped with such doping atoms may be n-doped.

The term "p-doped" may mean a host material that is doped with doping atoms that may accept weakly-bound outer electrons from the host material, thereby creating vacancies left behind by the electrons, known as holes. Such doping atoms are also generally referred to as acceptor atoms.

The term "n-doped" may mean a host material that is doped with doping atoms that may provide extra conduction electrons to the host material, thereby resulting in an electrically conductive n-doped host material with an excess number of mobile electrons (negatively charged carriers). Such doping atoms are also generally referred to as donor atoms.

In the context of various embodiments, where the host material may be for example silicon, which is a Group IV element, the host material may be doped or implanted with Group III doping atoms or elements, for example boron (B), aluminium (Al) or gallium (Ga), to form a p-doped material, or doped or implanted with Group V doping atoms or elements, for example phosphorus (P), arsenic (As) or antimony (Sb), to form an n-doped material.

In the context of various embodiments, doping may be carried out with a dopant concentration of between about $1 \times 10^{17}/cm^{-3}$ to about $5 \times 10^{20}/cm^{-3}$.

In various embodiments, the core portion may be p-doped and the peripheral portion may be n-doped or the core portion may be n-doped and the peripheral portion may be p-doped.

In various embodiments, the core portion and the peripheral portion of the nanowire 202 may define a diode.

In various embodiments, the resistive memory arrangement 200 may further include a second conductive layer (e.g. an electrode) in between the nanowire 202 and the resistive layer 204, wherein at least a portion of the second conductive layer may be arranged around the longitudinal axis and at least substantially surrounding the nanowire 202. In various embodiments, the second conductive layer may be part of the resistive memory cell 203.

In various embodiments, the resistive layer 204 and the second conductive layer may be arranged at least substantially coplanar relative to each other. This may mean that at least one respective surface (e.g. a top surface and/or a bottom surface) of the resistive layer 204 and the second conductive layer may be arranged in the same plane or flushed with each other.

In various embodiments, the resistive layer 204 and the second conductive layer may define an intrinsic diode.

In the context of various embodiments, the second conductive layer may include a metal, for example including but not limited to platinum (Pt), tungsten (W), nickel (Ni), aluminum (Al), a nitride alloy or any combination thereof. The nitride alloy may include but not limited to titanium nitride (TiN), tantalum nitride (TaN), hafnium nitride (HfN), aluminum nitride (AlN), tungsten nitride (WN) or any combination thereof.

In the context of various embodiments, the second conductive layer may have a thickness of between about 5 nm and about 10 nm, for example between about 5 nm and about 8 nm or between about 8 nm and about 10 nm.

In various embodiments, the resistive memory arrangement 200 may further include a peripheral layer in between the nanowire 202 and the resistive layer 204, wherein at least a portion of the peripheral layer may be arranged around the longitudinal axis and at least substantially surrounding the nanowire 202, wherein the nanowire 202 may be doped with doping atoms of a first conductivity type, wherein the peripheral layer may be doped with doping atoms of a second conductivity type, and wherein the second conductivity type is different from the first conductivity type. The first conductivity type and the second conductivity type may be as described above.

In various embodiments, the nanowire 202 may be p-doped and the peripheral layer may be n-doped or the nanowire 202 may be n-doped and the peripheral layer may be p-doped.

In various embodiments, the nanowire 202 and the peripheral layer may define a diode.

In the context of various embodiments, the peripheral layer may include a material including but not limited to silicon (Si), germanium (Ge), a III-V semiconductor and an alloy thereof. The alloy may include but not limited nickel silicide (NiSi), titanium silicide (TiSi), cobalt silicide (CoSi), nickel-platinum silicide (NiPtSi), nickel germanide (NiGe) and nickel-germanosilicide (NiGeSi).

In the context of various embodiments, the peripheral layer may have a thickness of between about 2 nm and about 10 nm, between about 2 nm and about 8 nm, between about 2 nm and about 5 nm or between about 5 nm and about 10 nm.

In various embodiments, the resistive memory arrangement 200 may further include a first peripheral layer in between the nanowire 202 and the resistive layer 204, wherein at least a portion of the first peripheral layer may be arranged around the longitudinal axis and at least substantially surrounding the nanowire 202, and a second peripheral layer in between the first peripheral layer and the resistive layer 204, wherein at least a portion of the second peripheral layer may be arranged around the longitudinal axis and at least substantially surrounding the portion of the first peripheral layer, wherein the first peripheral layer may be doped with doping atoms of a first conductivity type, wherein the second peripheral layer may be doped with doping atoms of a second conductivity type, and wherein the second conductivity type is different from the first conductivity type. The first conductivity type and the second conductivity type may be as described above.

In various embodiments, the first peripheral layer may be p-doped and the second peripheral layer may be n-doped or the first peripheral layer may be n-doped and the second peripheral layer may be p-doped.

In various embodiments, the first peripheral layer and the second peripheral layer may define a diode.

In the context of various embodiments, at least one of the first peripheral layer or the second peripheral layer may include a material including but not limited to silicon (Si), germanium (Ge), a III-V semiconductor and an alloy thereof. The alloy may include but not limited nickel silicide (NiSi), titanium silicide (TiSi), cobalt silicide (CoSi), nickel-platinum silicide (NiPtSi), nickel germanide (NiGe) and nickel-germanosilicide (NiGeSi).

In the context of various embodiments, the first peripheral layer may have a thickness of between about 5 nm and about 10 nm, for example between about 5 nm and about 8 nm or between about 8 nm and about 10 nm.

In the context of various embodiments, the second peripheral layer may have a thickness of between about 5 nm and about 10 nm, for example between about 5 nm and about 8 nm or between about 8 nm and about 10 nm.

In the context of various embodiments, the resistive memory arrangement 200 may further include a transistor having a first source/drain terminal, a second source/drain terminal and a gate terminal, wherein the first source/drain terminal may be electrically coupled to the resistive memory cell 203. In various embodiments, the nanowire 202 may be electrically coupled to a bit line as well as also serving as a contact to the first source/drain terminal. The gate terminal may be coupled to a word line.

In the context of various embodiments, the resistive memory arrangement 200 may further include a logic circuit electrically coupled to the nanowire 202 and/or the resistive memory cell 203. The logic circuit may be integrated and/or embedded with the resistive memory arrangement 200, and/or provided separate from the resistive memory arrangement 200. The logic circuit may include a transistor having a first source/drain terminal, a second source/drain terminal and a gate terminal.

In the context of various embodiments, the term "source/drain terminal" of a transistor may refer to a source terminal or a drain terminal. As the source terminal and the drain terminal of a transistor are generally fabricated such that these terminals are geometrically symmetrical, these terminals may be collectively referred to as source/drain terminals. In various embodiments, a particular source/drain terminal may be a "source" terminal or a "drain" terminal depending on the voltage to be applied to that terminal. Accordingly, the terms "first source/drain terminal" and "second source/drain terminal" may be interchangeable.

In the context of various embodiments, the term "coupled" may include electrical coupling and/or mechanical coupling. In the context of various embodiments, the term "coupled" may include a direct coupling and/or an indirect coupling. For example, two devices being coupled to each other may mean that there is a direct coupling path between the two devices and/or there is an indirect coupling path between the two devices, e.g. via one or more intervening devices.

In the context of various embodiments, the resistive memory arrangement 200 may include a plurality of resistive memory cells 203 spaced apart from each other along a length of the nanowire 202, wherein each resistive memory cell 203 of the plurality of resistive memory cells 203 includes a resistive layer 204 including a resistive changing material, wherein at least a portion of the resistive layer 204 may be arranged around the longitudinal axis and at least substantially surrounding the nanowire 202, and a conductive layer 206 arranged on at least a part of the resistive layer 204.

In other words, a plurality of stack arrangements, where each stack arrangement includes a resistive layer 204 and a conductive layer 206, thereby defining a resistive memory cell 203, may be arranged or formed along the length of the nanowires 202. The plurality of resistive memory cells 203 are spaced apart from each other with a gap defined between two adjacent resistive memory cells 203.

In the context of various embodiments, it should be appreciated that there are embodiments where the resistive layer 204 or a portion thereof may surround the nanowire 202 throughout the entire length of the nanowire 202, or the resistive layer 204 only covers an end (e.g. top end or top end surface) of the nanowire 202.

Figure 2B:
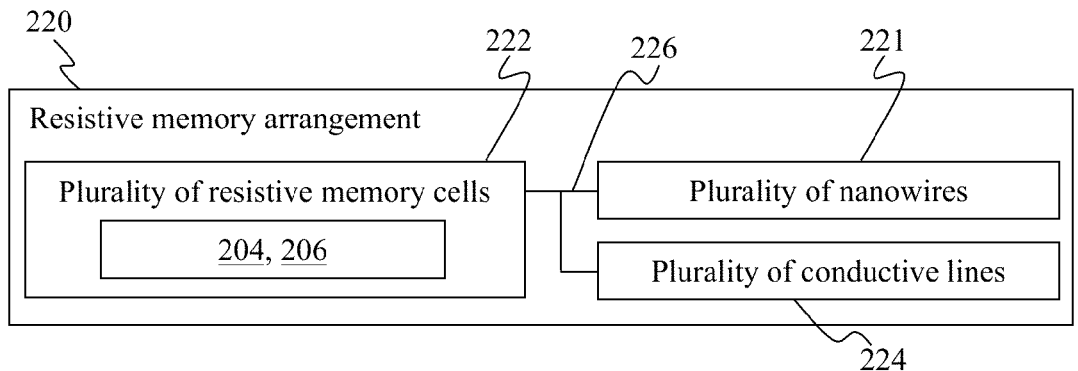
FIG. 2B shows a schematic block diagram of a resistive memory arrangement, according to various embodiments.

FIG. 2B shows a schematic block diagram of a resistive memory arrangement 220, according to various embodiments. The resistive memory cell arrangement 220 includes a plurality of nanowires 221, and a plurality of resistive memory cells 222, wherein each resistive memory cell 222 of the plurality of resistive memory cells 222 includes a resistive layer 204 including a resistive changing material, wherein at least a section of the resistive layer 204 is arranged covering at least a portion of a surface of a respective nanowire 221 of the plurality of nanowires 221, and a conductive layer 206 arranged on at least a part of the resistive layer 204, and a plurality of conductive lines 224 electrically coupled to the plurality of nanowires 221 and the plurality of resistive memory cells 222. In FIG. 2B, the line represented as 226 is illustrated to show the relationship between the plurality of nanowires 221, the plurality of resistive memory cells 222 and the plurality of conductive lines 224, which may include electrical coupling and/or mechanical coupling.

Each nanowire 221, each resistive memory cell 222, and the resistive layer 204 and conductive layer 206 of each resistive memory cell 222 may be as correspondingly described in the context of the resistive memory arrangement 200 of FIG. 2A.

In various embodiments, the plurality of conductive lines 224 may include a plurality of first conductive lines, wherein a respective first conductive line of the plurality of first conductive lines is electrically coupled to the respective nanowire 221, and, and a plurality of second conductive lines, wherein a respective second conductive line of the plurality of second conductive lines is electrically coupled to a respective memory cell 222 of the plurality of resistive memory cell 222. The plurality of first conductive lines may be bit lines (BLs).

Figure 2C:
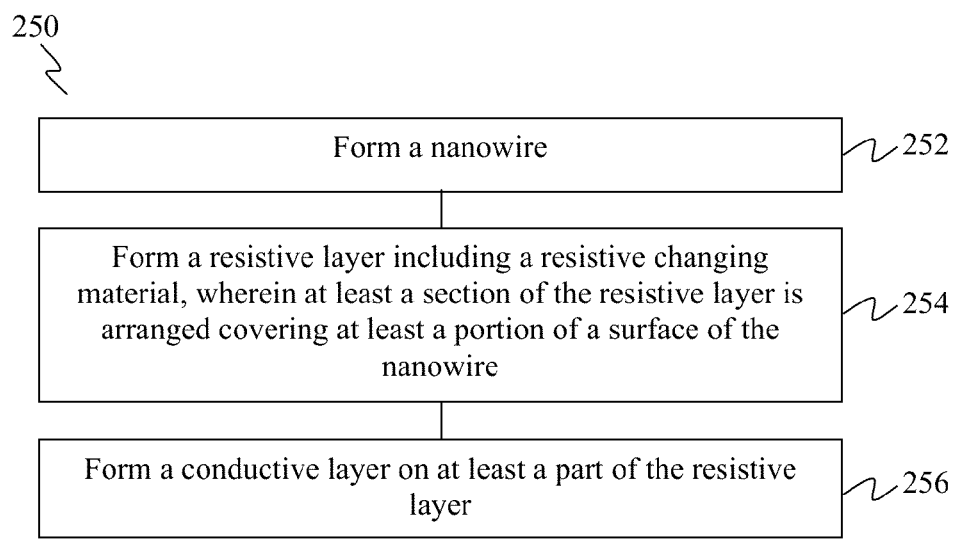
FIG. 2C shows a flow chart illustrating a method of forming a resistive memory arrangement, according to various embodiments.

FIG. 2C shows a flow chart 250 illustrating a method of forming a resistive memory arrangement, according to various embodiments.

At 252, a nanowire is formed. The nanowire may have a longitudinal axis.

At 254, a resistive layer including a resistive changing material is formed, wherein at least a section of the resistive layer is arranged covering at least a portion of a surface of the nanowire.

At 256, a conductive layer is formed on at least a part of the resistive layer.

In various embodiments, at 254, the resistive layer may be patterned, for example using lithography process.

In various embodiments, at 256, the conductive layer may be patterned, for example using lithography process.

Figure 3A:
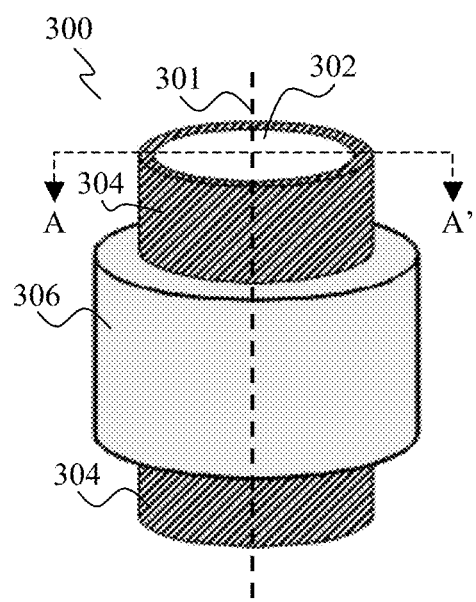
FIG. 3A shows a schematic perspective view of a resistive memory arrangement, according to various embodiments.
Figure 3B:
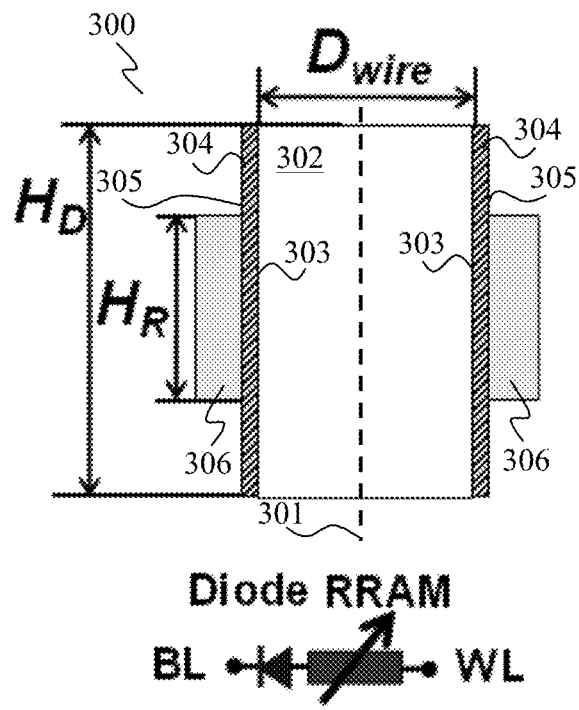
FIG. 3B shows a schematic cross sectional view of the resistive memory arrangement of the embodiment of FIG. 3A taken along the line A-A'.

FIG. 3A shows a schematic perspective view of a resistive memory arrangement 300, according to various embodiments, while FIG. 3B shows a schematic cross sectional view of the resistive memory arrangement 300 taken along the line A-A'. The resistive memory arrangement 300 includes a nanowire 302, a peripheral layer 304 and a RRAM cell (resistive memory cell) 306. The nanowire 302 may act as a contact, for example as a bottom electrode (BE) for the RRAM cell 306.

The peripheral layer 304 may be formed or arranged around the longitudinal axis 301 of the nanowire 302, at least substantially surrounding the nanowire 302. The peripheral layer 304 may be formed over or on the peripheral surface 303 or circumference of the nanowire 302. The peripheral layer 304 may be formed throughout the length of the nanowire 302. The peripheral layer 304 may be formed in contact with the nanowire 302. The peripheral layer 304 may behave as a rectifier and/or provide rectifying effect, and therefore may be or may form a diode (1D) on its own or may, together with the nanowire 302, form a diode. Therefore, an additional or separate diode may be provided for the resistive memory cell 300.

The RRAM cell (1R) 306 may be formed or arranged around the longitudinal axis 301 of the nanowire 302, at least substantially surrounding the peripheral layer 304 and the nanowire 302. The RRAM cell 306 may be formed over or on the peripheral surface 305 or circumference of the peripheral layer 304. The RRAM cell 306 may be formed in contact with the peripheral layer 304. The RRAM cell 306 may be formed at least substantially surrounding a partial portion of the nanowire 302 and the peripheral layer 304. The RRAM cell 306 may include a resistive layer and a conductive layer (e.g. as a top electrode (TE)) as will be described later.

Therefore, the RRAM cell 306 may extend laterally from the side or circumference of the nanowire 302. The additional diode selector or extrinsic diode including the peripheral layer 304, may be formed adjacent to the nanowire 302 and/or the RRAM cell 306, surrounding the nanowire 302 and extends laterally from the peripheral surface 303 or circumference of the nanowire 302. Therefore, the RRAM cell 306 may be formed over the diode, where both the RRAM cell 306 and the diode including the peripheral layer 304 extend laterally from the peripheral surface 303 or circumference of the nanowire 302, at least substantially perpendicular to the longitudinal axis 301. In other words, a 1D+1R stack may be formed surrounding the vertical nanowire 302.

The RRAM cell (1R) 306 and the 1D including the peripheral layer 304 may be stacked laterally in between a word line (WL) and a bit line (BL). This may allow control of the respective sizes of the RRAM cell 306 and the selector (i.e. diode) separately and flexibly by tuning the dimension or size of the nanowire diameter, $D_{wire}$ the RRAM cell height, $H_R$, and the diode height, $H_D$, to reach the drive current, $I_{SWITCH}$, required for reversible switching. Also, such a configuration or structure may pave the way to integrate one or more such resistive memory arrangements 300 with vertical nanowire CMOS devices, which may be desirable for embedded non-volatile memory (NVM) applications.

Figure 3C:
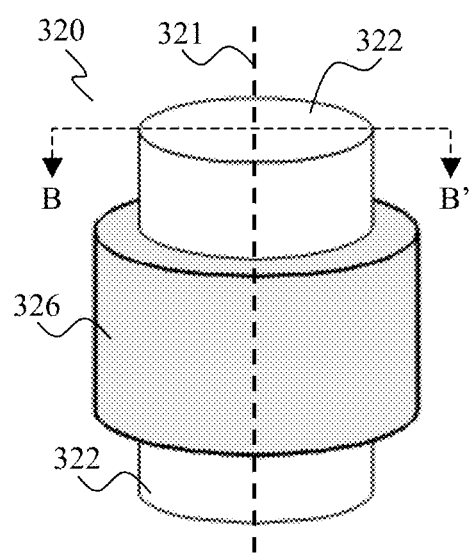
FIG. 3C shows a schematic perspective view of a resistive memory arrangement, according to various embodiments.
Figure 3D:
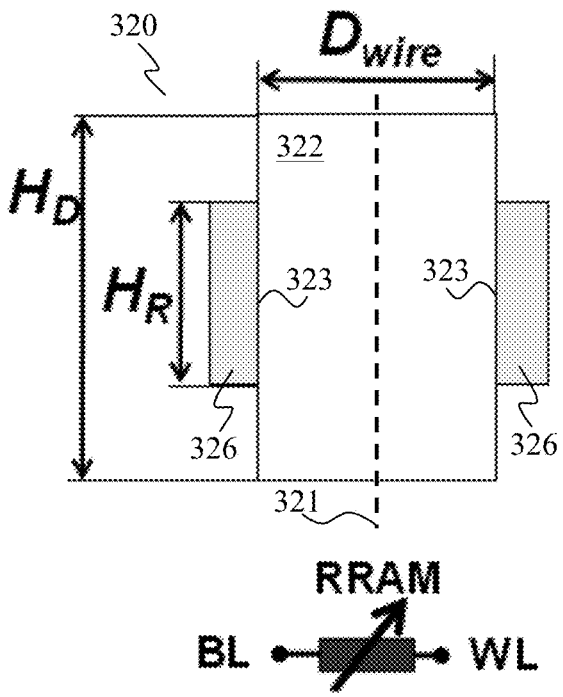
FIG. 3D shows a schematic cross sectional view of the resistive memory arrangement of the embodiment of FIG. 3C taken along the line B-B'.

FIG. 3C shows a schematic perspective view of a resistive memory arrangement 320, according to various embodiments, while FIG. 3D shows a schematic cross sectional view of the resistive memory arrangement 320 taken along the line B-B'. The resistive memory arrangement 320 includes a nanowire 322 and a RRAM cell (resistive memory cell) 326. The nanowire 322 may act as a contact, for example as a bottom electrode (BE) for the RRAM cell 326.

The RRAM cell (1R) 326 may be formed or arranged around the longitudinal axis 321 of the nanowire 322, at least substantially surrounding the nanowire 322. The RRAM cell 326 may be formed over or on the peripheral surface 323 or circumference of the nanowire 322. The RRAM cell 326 may be formed in contact with the nanowire 322. The RRAM cell 326 may be formed at least substantially surrounding a partial portion of the nanowire 302. The RRAM cell 306 may include a resistive layer and a conductive layer (e.g. as a top electrode (TE)) as will be described later.

Therefore, the RRAM cell 326 may extend laterally from the peripheral surface 323 or circumference of the nanowire 322, at least substantially perpendicular to the longitudinal axis 321. In other words, a 1R stack may be formed surrounding the vertical nanowire 322.

The arrangement of the nanowire 322 and the RRAM cell 326, and therefore the resistive memory arrangement 320, may show or exhibit self-rectifying properties or behaviour, e.g. a 1R configuration showing self-rectifying behaviour. The RRAM cell 326 may exhibit or possess self-rectifying properties or behaviour and therefore may behave as a diode, thereby providing an intrinsic diode. This means that the resistive memory arrangement 320 may exhibit or possess self-rectifying properties. Furthermore, in addition or alternatively, the nanowire 322 may be configured as a diode, for example by forming respective n-doped portion/region and p-doped portion/region. Therefore, a separate diode may not be necessary for the resistive memory arrangement 320, although it is not precluded that an additional or separate diode, for example as described in the context of the resistive memory arrangement 300, may be provided.

The RRAM cell (1R) 326, with the intrinsic diode, may allow separate and flexible control in tuning the dimension or size of the nanowire diameter, $D_{wire}$, the RRAM cell height, $H_R$, and the diode height, $H_D$, to reach the drive current, $I_{switch}$, required for reversible switching. Also, such a configuration or structure may pave the way to integrate one or more such resistive memory arrangements 320 with vertical nanowire CMOS devices, which may be desirable for embedded non-volatile memory (NVM) applications.

In various embodiments of resistive memory arrangements including 1R only (e.g. resistive memory arrangement 320) or 1D+1R (e.g. resistive memory arrangement 300), the RRAM cell (e.g. 306, 326) and the peripheral layer 304 may be directly formed around the nanowire (e.g. 302, 322) with no or a little, if any, planar space occupied. As shown in FIGS. 3A to 3D, there may be 2 stack structures, depending on the switching properties of the RRAM cells, i.e. with an extra diode selector (e.g. resistive memory arrangement 300, FIGS. 3A and 3B) or without an extra diode selector (e.g. resistive memory arrangement 320, FIGS. 3C and 3D). For the resistive memory arrangement 320, the RRAM cell 326 with the nanowire 322 as a bottom electrode, may possess self-rectifying properties to avoid or minimise any read error effect.

FIG. 4A shows a schematic top view of a resistive memory arrangement 400, according to various embodiments, while FIG. 4B shows a schematic cross sectional view of the resistive memory arrangement 400 taken along the line C-C'. The resistive memory arrangement 400 may be similar to the resistive memory arrangement 320 (FIGS. 3C and 3D), where the corresponding or like features of the resistive memory arrangement 400 may be as described in the context of the resistive memory arrangement 320. The resistive memory arrangement 400 includes a nanowire 402 and a RRAM cell (resistive memory cell) 406. The nanowire 402 may act as a contact, for example as a bottom electrode (BE) for the RRAM cell 406.

The RRAM cell 406 may include a resistive layer 408 arranged around the longitudinal axis 401 of the nanowire 402 and at least substantially surrounding the nanowire 402, and a conductive layer 410 arranged at least substantially surrounding the resistive layer 408. The resistive layer 408, and therefore also the RRAM cell 406 may be formed over or on the peripheral surface 403 or circumference of the nanowire 402. The resistive layer 408 may be formed in contact with the nanowire 402. The conductive layer 410 may act as a contact, for example as a top electrode (TE) for the RRAM cell 406. As illustrated in FIG. 4B, the conductive layer 410 may be confined within the boundary or height of the resistive layer 408, and forming a stack structure.

The RRAM cell 406, and therefore also the resistive layer 408 may be formed at least substantially surrounding a partial portion of the nanowire 402. This also means that the conductive layer 410 at least substantially surrounds the partial portion of the nanowire 402. The conductive layer 410 may be formed over or on the resistive layer 408. The conductive layer 410 may be formed in contact with the resistive layer 408. The resistive layer 408 and the conductive layer 410 may be arranged or formed at least substantially coplanar relative to each other, as illustrated in FIG. 4B.

Therefore, the RRAM cell 406 may extend laterally from the peripheral surface 403 or circumference of the nanowire 402, at least substantially perpendicular to the longitudinal axis 401. In other words, a 1R stack may be formed surrounding the vertical nanowire 402.

The stack arrangement of the nanowire 402, the resistive layer 408 and the conductive layer 410, may show or exhibit self-rectifying properties, thereby behaving as a diode. In various embodiments, the resistive layer 408 and the conductive layer 410 may form or define an intrinsic diode. In further embodiments, the resistive layer 408 and the nanowire 402 may form or define an intrinsic diode.

FIG. 4C shows a schematic perspective view of a resistive memory arrangement 450, according to various embodiments while FIG. 4D shows a schematic cross sectional view of the resistive memory arrangement 450 taken along the line D-D'. The resistive memory arrangement 450 includes a nanowire 402 and a RRAM cell 406 having a resistive layer 408 and a conductive layer 410, which may be as described in the context of the resistive memory arrangement 400, except that the nanowire 402 of the resistive memory arrangement 450 includes a core portion/region (e.g. region 1) 452 and a peripheral portion/region (e.g. region 2) 454 at least substantially surrounding the core portion 452. The core portion 452 may be p-doped or n-doped (P/N-type) while the peripheral portion 454 may be n-doped or p-doped (N/P-type). In other words, the core portion 452 may be p-doped while the peripheral portion 454 may be n-doped or the core portion 452 may be n-doped while the peripheral portion 454 may be p-doped. Therefore, by having the core portion 452 and the peripheral portion 454 respectively doped with doping atoms different or opposite conductivity types, n-doped region and p-doped region may be formed within the nanowire 402, thereby forming a diode within the nanowire 402.

Figure 5A:
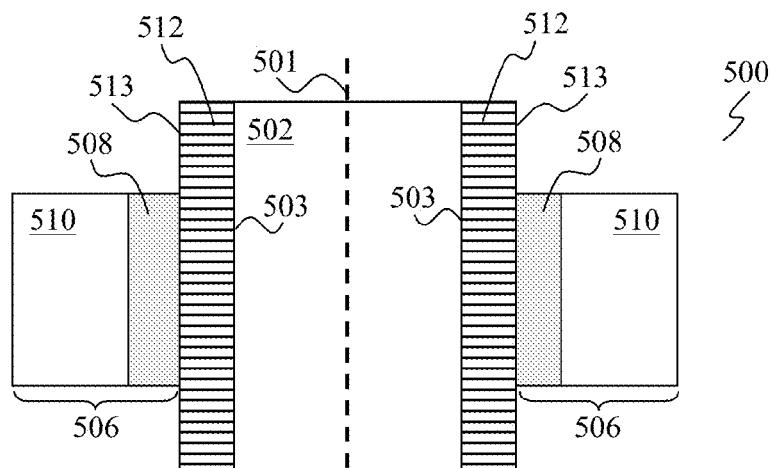
FIGS. 5A to 5C show schematic cross sectional views of respective resistive memory arrangements, according to various embodiments.

FIG. 5A shows a schematic cross sectional view of a resistive memory arrangement 500, according to various embodiments. The resistive memory arrangement 500 includes a nanowire 502 and a RRAM cell (resistive memory cell) 506. The nanowire 502 may be doped, for example n-doped (N-type) or p-doped (P-type).

The RRAM cell (1R) 506 may be formed or arranged around the longitudinal axis 501 of the nanowire 502, at least substantially surrounding the nanowire 502. The RRAM cell 506 may include a resistive layer 508 arranged around the longitudinal axis 501 of the nanowire 502 and at least substantially surrounding the nanowire 502, and a conductive layer 510 arranged at least substantially surrounding the resistive layer 508. The conductive layer 510 may act as a contact, for example as a top electrode (TE) for the RRAM cell 506. As illustrated in FIG. 5A, the conductive layer 510 may be confined within the boundary or height of the resistive layer 508, and forming a stack structure. The resistive layer 508 and the conductive layer 510 may be arranged or formed at least substantially coplanar relative to each other.

The resistive memory arrangement 500 further includes a second conductive layer 512 formed or arranged around the longitudinal axis 501 of the nanowire 502, at least substantially surrounding the nanowire 502. The second conductive layer 512 may be formed over or on the peripheral surface 503 or circumference of the nanowire 502. The second conductive layer 512 may be formed throughout the length of the nanowire 502. The second conductive layer 512 may be formed in contact with the nanowire 502. The second conductive layer 512 may form part of the RRAM cell 506. The RRAM cell 506 may act as a contact, for example as a bottom electrode (BE) for the resistive memory arrangement 500.

As illustrated in FIG. 5A, the resistive layer 508, and therefore also the RRAM cell 506, may be formed or arranged around the longitudinal axis 501 of the nanowire 502, at least substantially surrounding the second conductive layer 512 and the nanowire 502. The resistive layer 508, and therefore also the RRAM cell 506, may be formed over or on the peripheral surface 513 or circumference of the second conductive layer 512. The resistive layer 508 may be formed in contact with the second conductive layer 512. The conductive layer 510 may be formed in contact with the resistive layer 508.

The RRAM cell 506, and therefore also the resistive layer 508, may be formed at least substantially surrounding a partial portion of the nanowire 502 and the second conductive layer 512. This also means that the conductive layer 510 at least substantially surrounds the partial portion of the nanowire 502. The resistive layer 508 and the conductive layer 510 may be arranged or formed at least substantially coplanar relative to each other, as illustrated in FIG. 5A.

Therefore, the RRAM cell 506 may extend laterally from the peripheral surface 503 or circumference of the nanowire 502. The second conductive layer 512 may be formed adjacent to the nanowire 502 and/or the RRAM cell 506, surrounding the nanowire 502 and extends laterally from the peripheral surface 503 or circumference of the nanowire 502. Therefore, the RRAM cell 506 may be formed over the second conductive layer 512, where both the RRAM cell 506 and the second conductive layer 512 extend laterally from the peripheral surface 503 or circumference of the nanowire 502, at least substantially perpendicular to the longitudinal axis 501. In other words, a 1R stack may be formed surrounding the vertical nanowire 502.

The stack arrangement of the nanowire 502, the resistive layer 508, the conductive layer 510 and the second conductive layer 512, may show or exhibit self-rectifying properties, thereby behaving as a diode. In various embodiments, the resistive layer 508 and the conductive layer 510 may form or define an intrinsic diode. In further embodiments, the resistive layer 508 and the second conductive layer 512 may form or define an intrinsic diode. In yet further embodiments, the resistive layer 508 and the nanowire 502 or the nanowire core may form or define an intrinsic diode.

Figure 5B:
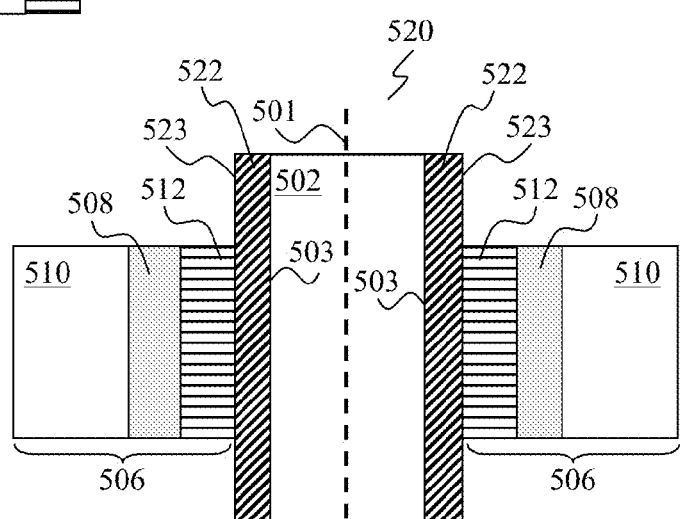

FIG. 5B shows a schematic cross sectional view of a resistive memory arrangement 520, according to various embodiments. The resistive memory arrangement 520 includes a nanowire 502, a peripheral layer 522 and a RRAM cell (resistive memory cell) 506. The resistive memory arrangement 520 may be similar to the resistive memory arrangement 300 (FIGS. 3A and 3B). The peripheral layer 522 may act as a contact, for example as a bottom electrode (BE) for the RRAM cell 506.

The peripheral layer 522 may be formed or arranged around the longitudinal axis 501 of the nanowire 502, at least substantially surrounding the nanowire 502. The peripheral layer 522 may be formed over or on the peripheral surface 503 or circumference of the nanowire 502. The peripheral layer 522 may be formed throughout the length of the nanowire 502. The peripheral layer 522 may be formed in contact with the nanowire 502.

The nanowire 502 may be p-doped or n-doped (P/N-type) while the peripheral layer 522 may be n-doped or p-doped (N/P-type). In other words, the nanowire 502 may be p-doped while the peripheral layer 522 may be n-doped or the nanowire 502 may be n-doped while the peripheral layer 522 may be p-doped. Therefore, by having the nanowire 502 and the peripheral layer 522 respectively doped with doping atoms different or opposite conductivity types, n-doped region and p-doped region formed within the nanowire 502 and the peripheral layer 522 may form or define a diode (1D). Therefore, the nanowire 502 may serve as one component of the diode.

The RRAM cell (1R) 506 may be formed or arranged around the longitudinal axis 501, at least substantially surrounding the peripheral layer 522 and the nanowire 502. The RRAM cell 506 may include a resistive layer 508 arranged around the longitudinal axis 501 and at least substantially surrounding the nanowire 502, and a conductive layer 510 arranged at least substantially surrounding the resistive layer 508. The resistive RRAM cell 506 may further optionally include a second conductive layer 512 formed or arranged around the longitudinal axis 501, at least substantially surrounding the nanowire 502. The second conductive layer 512 is arranged in between the nanowire 502 and the resistive layer 508. The second conductive layer 512 may be formed over or on the peripheral surface 523 or circumference of the peripheral layer 522. The second conductive layer 512 may be formed in contact with the peripheral layer 522. The resistive layer 508 may be formed in contact with the second conductive layer 512. The conductive layer 510 may be formed in contact with the resistive layer 508.

As illustrated in FIG. 5B, the conductive layer 510 may be confined within the boundary or height of the resistive layer 508. The resistive layer 508 and the conductive layer 510 may be arranged or formed at least substantially coplanar relative to each other. The resistive layer 508 and the second conductive layer 512 may be arranged or formed at least substantially coplanar relative to each other. The resistive layer 508, the conductive layer 510 and the second conductive layer 512 may form a stack structure.

The conductive layer 510 may act as a contact, for example as a top electrode (TE) for the RRAM cell 506. The second conductive layer 512 may act as a contact, for example as a bottom electrode (BE) for the RRAM cell 506.

The RRAM cell 506, and therefore also the resistive layer 508, may be formed at least substantially surrounding a partial portion of the nanowire 502 and the peripheral layer 522. This also means that the conductive layer 510 and the second conductive layer 512 may at least substantially surround the partial portion of the nanowire 502.

Therefore, the RRAM cell 506 may extend laterally from the peripheral surface 503 or circumference of the nanowire 502. The peripheral layer 522 may be formed adjacent to the nanowire 502 and/or the RRAM cell 506, surrounding the nanowire 502 and extends laterally from the peripheral surface 503 or circumference of the nanowire 502. Therefore, the RRAM cell 506 may be formed over the peripheral layer 522, where both the RRAM cell 506 and the peripheral layer 522 extend laterally from the peripheral surface 503 or circumference of the nanowire 502, at least substantially perpendicular to the longitudinal axis 501. In other words, a 1D+1R stack may be formed surrounding the vertical nanowire 502.

Figure 5C:
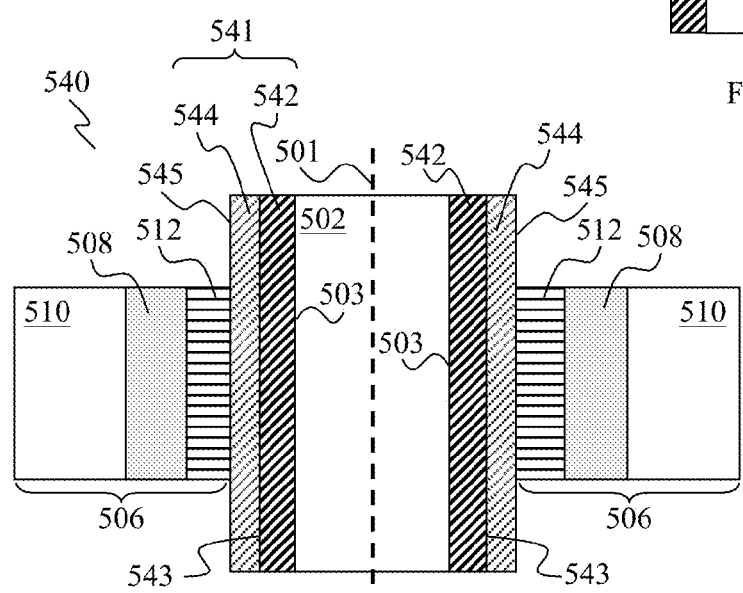

FIG. 5C shows a schematic cross sectional view of a resistive memory arrangement 540, according to various embodiments. The resistive memory arrangement 540 may be as described in the context of the resistive memory arrangement 520, except that the peripheral layer 522 of the resistive memory arrangement 520 is replaced by a two-layer peripheral structure 541 arranged around the longitudinal axis 501 of the nanowire 502, at least substantially surrounding the nanowire 502 in the resistive memory arrangement 540. In addition, the nanowire 502 may be undoped of the resistive memory arrangement 540. The resistive memory arrangement 540 may be similar to the resistive memory cell 300 (FIGS. 3A and 3B).

The two-layer peripheral structure 541 includes a first peripheral layer 542 formed or arranged in between the nanowire 502 and the resistive layer 508, being arranged around the longitudinal axis 501 and at least substantially surrounding the nanowire 502. The first peripheral layer 542 may be formed over or on the peripheral surface 503 or circumference of the nanowire 502. The first peripheral layer 542 may be formed throughout the length of the nanowire 502. The first peripheral layer 542 may be formed in contact with the nanowire 502.

The two-layer peripheral structure 541 further includes a second peripheral layer 544 in between the first peripheral layer 542 and the resistive layer 508, the second peripheral layer 544 being arranged around the longitudinal axis 501 and at least substantially surrounding the first peripheral layer 542. The second peripheral layer 544 may be formed over or on the peripheral surface 543 or circumference of the first peripheral layer 542. The second peripheral layer 544 may be formed throughout the length of the nanowire 502. The second peripheral layer 544 may be formed in contact with first peripheral layer 542. The first peripheral layer 542 and the second peripheral layer 544 may be arranged or formed at least substantially coplanar relative to each other.

The first peripheral layer 542 may be p-doped or n-doped (P/N-type) while the second peripheral layer 544 may be n-doped or p-doped (N/P-type). In other words, the first peripheral layer 542 may be p-doped while the second peripheral layer 544 may be n-doped or the first peripheral layer 542 may be n-doped while the second peripheral layer 544 may be p-doped. Therefore, by having the first peripheral layer 542 and the second peripheral layer 544 respectively doped with doping atoms of different or opposite conductivity types, n-doped region and p-doped region formed within the first peripheral layer 542 and the second peripheral layer 544 may form or define a diode (1D). Therefore, the nanowire 502 may serve as a contact (e.g. as a bottom electrode (BE)) electrically connected with the diode.

The RRAM cell (1R) 506 may be formed over or on the peripheral surface 545 or circumference of the second peripheral layer 544. The RRAM cell (1R) 506 may be formed in contact with the second peripheral layer 544.

Therefore, the RRAM cell 506 may extend laterally from the peripheral surface 503 or circumference of the nanowire 502. The first peripheral layer 542 and the second peripheral layer 544 may be formed adjacent to the nanowire 502 and/or the RRAM cell 506, surrounding the nanowire 502 and extends laterally from the peripheral surface 503 or circumference of the nanowire 502. Therefore, the RRAM cell 506 may be formed over the first peripheral layer 542 and the second peripheral layer 544, where the RRAM cell 506, the first peripheral layer 542 and the second peripheral layer 544 extend laterally from the peripheral surface 503 or circumference of the nanowire 502, at least substantially perpendicular to the longitudinal axis 501. In other words, a 1D+1R stack may be formed surrounding the vertical nanowire 502.

Various embodiments may also provide three-dimensional (3-D) multi stacks of RRAM cells for a resistive memory arrangement, with either a 1R architecture or a 1D+1R architecture, based on the embodiments of FIGS. 3A to 3D, 4A to 4D and 5A to 5C. The three-dimensional (3-D) multi stacks may be implemented or arranged around the same nanowire, for example, for high density 3-D multi-stacked RRAM applications. The number of multi-stacked RRAM cells around a nanowire may be two, three, four, five or any higher number of RRAM cells around the nanowire, thereby offering 3-D capability.

Figures 6A, 6B:
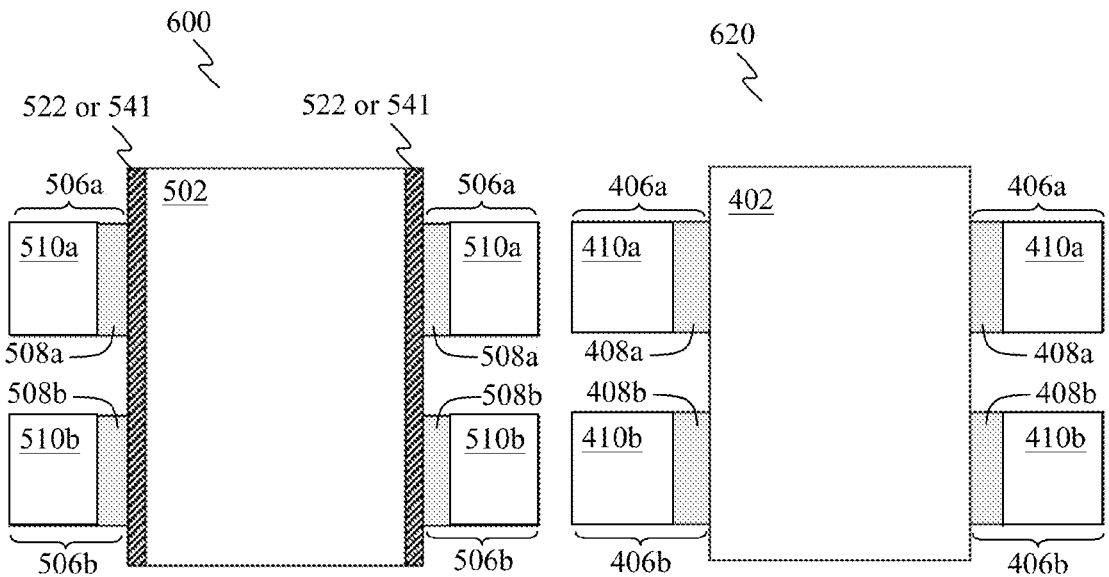
FIGS. 6A and 6B show schematic cross sectional views of respective resistive memory arrangements with multi stacked resistive memory cells, according to various embodiments.

FIG. 6A shows a schematic cross sectional view of a resistive memory arrangement 600 with a multi or plurality of stacked resistive memory cells 506a, 506b, according to various embodiments. The resistive memory arrangement 600 may be based on the embodiments of FIG. 5B or 5C, and having, as a non-limiting example, a nanowire 502 which may be as described in the context of the embodiment of FIG. 5B or 5C, a peripheral layer 522 or 541 which may be as described in the context of the embodiments of FIGS. 5B and 5C respectively, and two RRAM cells, e.g. a first RRAM cell 506a and a second RRAM cell 506b arranged spaced apart from each other along the length of the nanowire 502. It should be appreciated that any higher number of RRAM cells may be provided, spaced apart from each other.

The first RRAM cell 506a includes a resistive layer 508a and a conductive layer 510a, and the second RRAM cell 506b includes a resistive layer 508b and a conductive layer 510b. Each of the resistive layers 508a, 508b may be as described in the context of the resistive layer 508 of the embodiments of FIG. 5B or 5C. Each of the conductive layers 510a, 510b may be as described in the context of the conductive layer 510 of the embodiments of FIG. 5B or 5C. It should be appreciated that while not shown, the second conductive layer 512 as described in the context of the embodiments of FIG. 5B or 5C may be formed in the respective first RRAM cell 506a and the second RRAM cell 506b.

FIG. 6B shows a schematic cross sectional view of a resistive memory arrangement 620 with a multi or plurality of stacked resistive memory cells 406a, 406b, according to various embodiments. The resistive memory arrangement 620 may be based on the embodiment of FIGS. 4A and 4B, and having, as a non-limiting example, a nanowire 402 which may be as described in the context of the embodiment of FIGS. 4A and 4B, and two RRAM cells, e.g. a first RRAM cell 406a and a second RRAM cell 406b arranged spaced apart from each other along the length of the nanowire 402. It should be appreciated that any higher number of RRAM cells may be provided, spaced apart from each other.

The first RRAM cell 406a includes a resistive layer 408a and a conductive layer 410a, and the second RRAM cell 506b includes a resistive layer 408b and a conductive layer 410b. Each of the resistive layers 408a, 408b may be as described in the context of the resistive layer 408 of the embodiments of FIGS. 4A and 4B. Each of the conductive layers 410a, 410b may be as described in the context of the conductive layer 410 of the embodiments of FIGS. 4A and 4B.

It should be appreciated any one of the resistive memory arrangements 300, 320, 400, 450, 500, 520, 540 may be provided with a plurality of resistive memory cells spaced apart from each other along the length of the respective nanowire.

In various embodiments, during fabrication of the resistive memory arrangements of various embodiments, different fabrication methods may be employed to obtain or form an electrical contact between the nanowires and the bit lines (BL). Different contact modes may be formed, for example from the top of the nanowire as illustrated for the resistive memory arrangement 700 of FIG. 7A, or from the bottom of the nanowire as illustrated for the resistive memory arrangement 720 of FIG. 7B, where the resistive memory arrangement 700 and the resistive memory arrangement 720 may be based on the embodiments of FIGS. 3A to 3D, 4A to 4D, 5A to 5C, 6A and 6B. This provides more integration choices for different RRAM stacks.

Each of the resistive memory arrangements 700 (FIG. 7A), 720 (FIG. 7B) includes a nanowire 702 extending from a substrate 704 having a buried oxide layer 706. Each of the resistive memory arrangements 700, 720 further includes a RRAM cell 708, where a portion of the RRAM cell 708 at least substantially surrounds the nanowire 702. The RRAM cell 708 has at least a resistive layer and a conductive layer. Therefore, at least a portion of the resistive layer may be arranged at least substantially surrounding the nanowire 702. In various embodiments, each of the resistive memory arrangements 700, 720 may show or exhibit self-rectifying properties or behaviour, e.g. a 1R configuration showing self-rectifying behaviour.

The resistive memory arrangement 700 may further include a passivation layer (e.g. insulation oxide) 710 at least substantially surrounding the top end region of the nanowire 702, and another passivation layer (e.g. insulation oxide) 712 at least substantially surrounding the bottom end region of the nanowire 702, at least a portion of the RRAM cell 708 and the passivation layer 710. A contact (e.g. a contact pad) 714, for example made of metal, may be formed on or over the top of the nanowire 702, where the contact 714 may be electrically coupled to a bit line (BL). A contact (e.g. a contact pad) 716, for example made of metal, may be formed on or over the passivation layer 712, and extending through a through via 718 and electrically coupled to the RRAM cell 708. The contact 716 may be electrically coupled to a word line (WL).

For the resistive memory arrangement 720, at least a portion of the RRAM cell 708 may be arranged at least substantially surrounding the nanowire 702 and over the top of the nanowire 702. It should be appreciated that the RRAM 708 may be formed at least substantially along the length of the nanowire 702, pushing down the RRAM 708 all the way and contact with the substrate 704 directly. The resistive memory arrangement 720 may further include a passivation layer 712 at least substantially surrounding the bottom end region of the nanowire 702 and the RRAM cell 708. A contact (e.g. a contact pad) 714, for example made of metal, may be formed on or over the passivation layer 712, and extending through a through via 715 and electrically coupled to the bottom end region of the nanowire 702 or the substrate 704. The contact 714 may be electrically coupled to a bit line (BL). A contact (e.g. a contact pad) 716, for example made of metal, may be formed on or over the passivation layer 712, and extending through a through via 718 and electrically coupled to the RRAM cell 708. The contact 716 may be electrically coupled to a word line (WL).

Figures 7A, 7B:
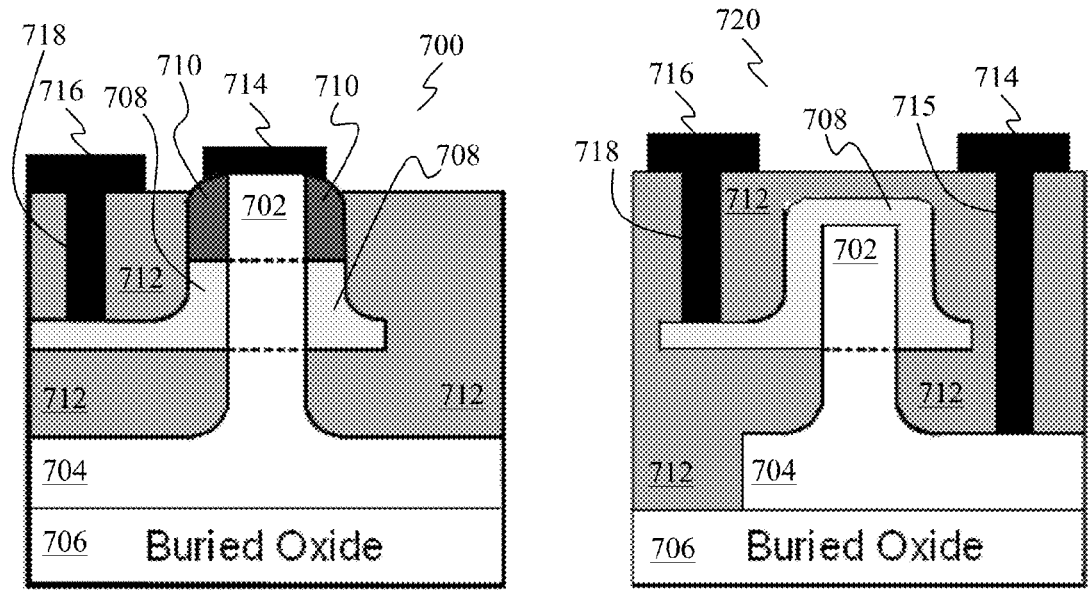
FIGS. 7A and 7B show schematic cross sectional views of respective resistive memory arrangements, according to various embodiments.
Figure 8:
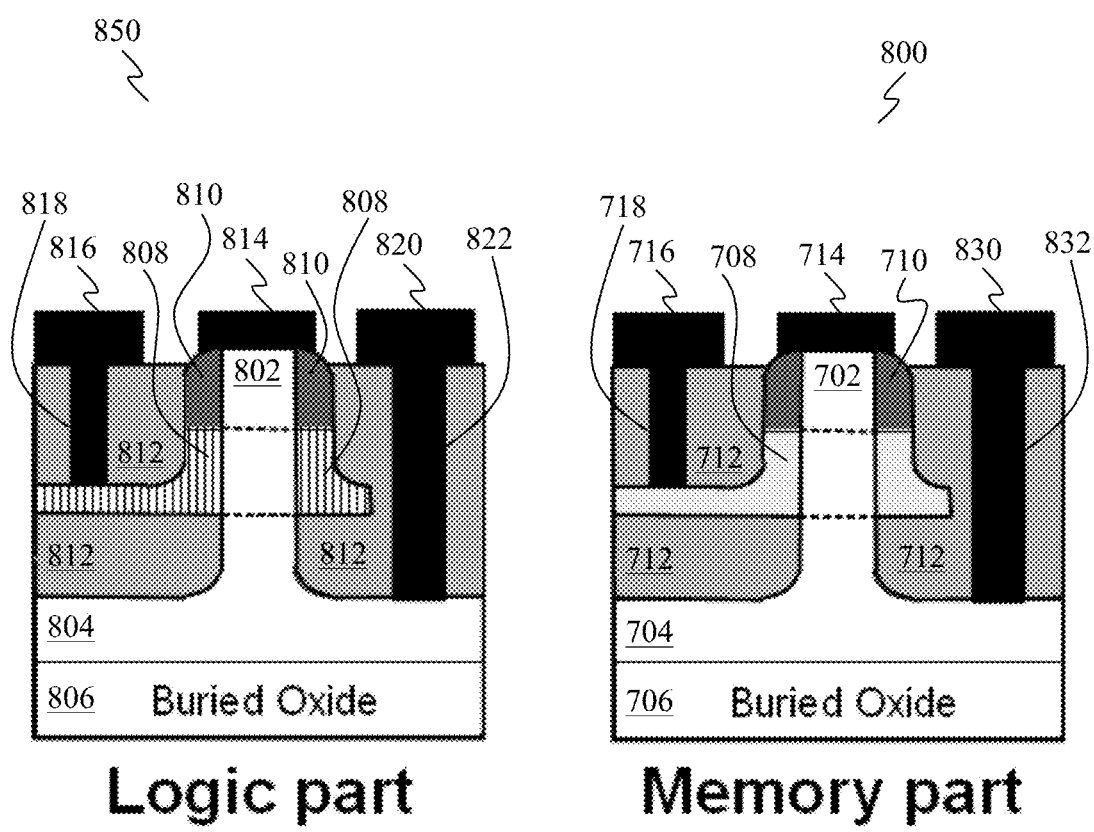
FIG. 8 shows a schematic cross sectional view of a parallel integration of a resistive memory arrangement with a logic CMOS device, according to various embodiments.
Figure 9C:
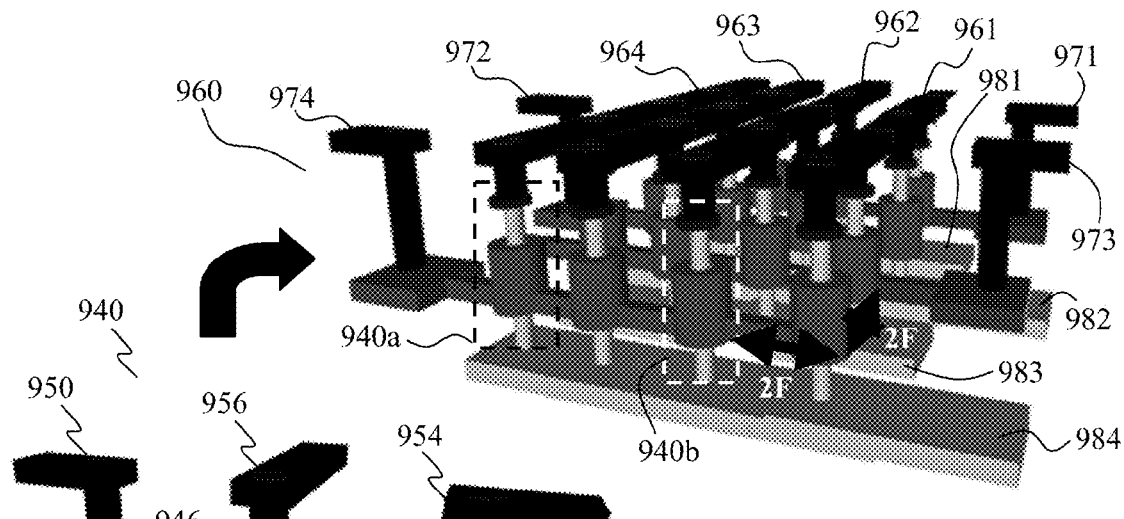
FIG. 9C shows a schematic cross sectional view of a vertical integration of a resistive memory arrangement with a logic CMOS device, according to various embodiments.

The process flow of various embodiments, for example for the embodiment of FIG. 7A, may be compatible with vertical gate all around (GAA) nanowire CMOS technology. Therefore, it may be possible to integrate the memory unit cells or resistive memory cells or resistive memory arrangements with logic CMOS devices (e.g. vertical nanowire CMOS devices) within one chip for embedded memory applications. Hence, in various embodiments, different approaches may be employed for integrating the resistive memory arrangements of various embodiments with logic CMOS devices for embedded memory applications, for example integrating them in parallel within one chip as illustrated in FIG. 8, or to integrate them vertically on the same nanowire within one chip as illustrated in FIGS. 9A and 9C. Depending on the design rule and specific RRAM switching properties, there may be several options to get or form a contact between nanowires and bit lines (BLs), for example from the top of the nanowire and/or from the bottom of the nanowire.

FIG. 8 shows a schematic cross sectional view of a parallel integration of a resistive memory arrangement (memory part) 800 with a logic CMOS device (logic part) 850, according to various embodiments, where the stack(s) or structure(s) around the respective nanowires 702, 802, for the resistive memory arrangement 800 and the logic CMOS device 850, may be at least substantially similar. The overall structures for the resistive memory arrangement 800 and the logic CMOS device 850 may be at least substantially similar as well. The resistive memory arrangement 800 and the logic CMOS device 850 may be arranged or embedded in parallel and separately in a single chip (e.g. a system-on-ship), and may be electrically coupled to each other in the chip. As a non-limiting example, electrical coupling between the resistive memory arrangement 800 and the logic CMOS device 850 may be carried out at the module (or block) level.

The resistive memory arrangement 800 may be as described in the context of the resistive memory arrangement 700 of FIG. 7A, with the addition of a further contact (e.g. a contact pad) 830, for example made of metal, which may be formed on or over the passivation layer 712, and extending through a through via 832 and electrically coupled to the bottom end region of the nanowire 702 or the base layer 704. In various embodiments, the resistive memory arrangement 800 may show or exhibit self-rectifying properties or behaviour, e.g. a 1R configuration showing self-rectifying behaviour. Any one of or each of the contacts 714, 830 may enable electrical coupling between the nanowire 702 and a bit line (BL). In various embodiments, the resistive memory arrangement 800 may further include a transistor (1T), for example to form a 1T+1R architecture, as will be described later with reference to FIGS. 9A and 9C, and which may have a similar structure as shown for the embodiments of FIGS. 9A and 9C.

The logic CMOS device 850 may have an at least substantially similar structure or configuration, and/or material system as that of the resistive memory arrangement 800.

The logic CMOS device 850 includes a nanowire 802 extending from a substrate 804 having a buried oxide layer 806. The logic CMOS device 850 further includes a logic circuit 808 at least substantially surrounding the nanowire 802.

The logic CMOS device 850 may further include a passivation layer (e.g. insulation oxide) 810 at least substantially surrounding the top end region of the nanowire 802, and another passivation layer (e.g. insulation oxide) 812 at least substantially surrounding the bottom end region of the nanowire 802, the logic circuit 808 and the passivation layer 810. A contact (e.g. a contact pad) 814, for example made of metal, may be formed on or over the top of the nanowire 802. A contact (e.g. a contact pad) 816, for example made of metal, may be formed on or over the passivation layer 812, and extending through a through via 818 and electrically coupled to the logic circuit 808. A further contact (e.g. a contact pad) 820, for example made of metal, which may be formed on or over the passivation layer 812, and extending through a through via 822 and electrically coupled to the bottom end region of the nanowire 802 or the base layer 804.

The logic circuit 808 may include, for example, a transistor (e.g. MOSFET) having a gate terminal that at least substantially surrounds the nanowire 802, thereby providing a gate all around (GAA) nanowire transistor.

FIG. 9A shows a schematic perspective view of a vertical integration of a resistive memory arrangement with a logic CMOS device in the form of a transistor 944, according to various embodiments, thereby providing a 1T+1R resistive memory arrangement 940. The integrated resistive memory arrangement 940 represents a single unit 1T+1R arrangement. The transistor 944 may be a gate all around n/p-channel (GAA NP) MOSFET. The integrated resistive memory arrangement 940 includes a nanowire 946 and a RRAM cell 942 stacked on top of the nanowire 946. This may mean that the RRAM cell 942 may be arranged on top of the nanowire 946, e.g. on top of a top end surface of the nanowire 946. For example, the nanowire 946 may have a longitudinal axis, and wherein RRAM cell 942 may be stacked on top or over a surface of the nanowire 202 that is arranged at least substantially parallel to a plane which intersects the longitudinal axis. The entire RRAM cell 942 may be stacked on top of the nanowire 946. The RRAM cell 942 may exhibit self-rectifying property or behaviour, for example for embedded memory applications.

A gate (G) terminal 948 of the transistor 944 is arranged with at least a portion at least substantially surrounding the nanowire 946, thereby providing a GAA configuration. The gate terminal 948 is connected to a gate contact 950. A source (S) terminal 952 is coupled to one end of the nanowire 946, where a source contact 954 is connected to the source terminal 952. A drain (D) contact 956 is connected to the other end of the nanowire 946 and the RRAM cell 942.

Figure 9B:
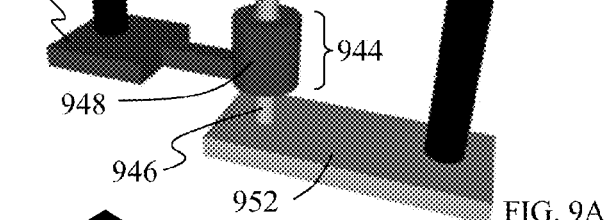
FIG. 9B shows a schematic perspective view of an array of resistive memory arrangements with logic CMOS devices, based on the embodiment of FIG. 9A.
Figure 9A:
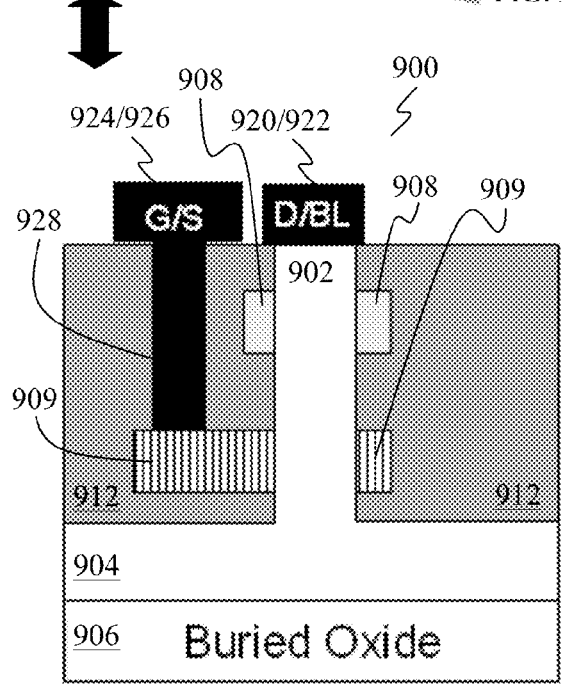
FIG. 9A shows a schematic perspective view of a vertical integration of a resistive memory arrangement with a logic CMOS device, according to various embodiments.
Figure 9A:
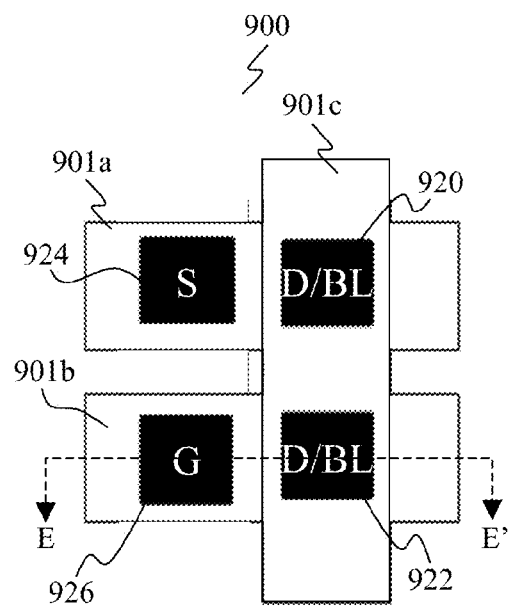

FIG. 9B shows a schematic perspective view of an array 960 of resistive memory arrangements with logic CMOS devices, based on the embodiment of FIG. 9A. The memory array 960 includes 4×4 1T+1R coupled to four bit lines, BL1 961, BL2 962, BL3 963, BL4 964, four word lines, WL1 971, WL2 972, WL3 973, WL4 974, and four source lines, SL1 981, SL2 982, SL3 983, SL4 984. As a non-limiting example, the single unit cell 940a is coupled to BL4 964, WL4 974 and SL4 984, while the single unit cell 940b is coupled to BL2 962, WL4 974 and SL4 984. The source terminal/contact of the respective single unit cell (e.g. 940a, 940b) is coupled to a source line. The gate terminal/contact of the respective single unit cell (e.g. 940a, 940b) is coupled to a word line. The drain terminal/contact of the respective single unit cell (e.g. 940a, 940b) and a bit line may overlap together. The memory array 960 shows a period or pitch of 2 F (F refers to the minimum feature size) between adjacent single unit cells, thereby realizing a cell arrangement size of 4 $F^2$ footprint.

FIG. 9C shows a schematic cross sectional view of a vertical integration of a resistive memory arrangement with a logic CMOS device, according to various embodiments. The respective resistive memory arrangements of the embodiments of FIGS. 3A to 3D, 4A to 4D, 5A to 5C, 6A and 6B, and 7A and 7B may be employed.

As a non-limiting example, the integrated resistive memory arrangement 900 includes a nanowire 902, a RRAM cell 908 at least substantially surrounding the nanowire 902, and a logic circuit 909 at least substantially surrounding the nanowire 902, where the RRAM cell 908 and the logic circuit 909 may be arranged spaced apart from each other along the length of the nanowire 902. The nanowire 902 extends from a substrate 904 having a buried oxide layer 906. The RRAM cell 908 may have at least a resistive layer and a conductive layer, where at least a portion of the resistive layer may at least substantially surround the nanowire 902. The logic circuit 909 may include or may be, for example, a transistor (e.g. MOSFET, e.g. n/p-channel MOSFET) having a source (S)

terminal, a drain (D) terminal and a gate (G) terminal, thereby providing a 1T+1R resistive memory arrangement. The integrated resistive memory arrangement 900 represents a single unit 1T+1R arrangement. The gate terminal may at least substantially surround the nanowire 902, thereby providing a gate all around (GAA) nanowire transistor or GAA vertical transistor. In this way, in one embodiment, the RRAM cell 908 may be arranged over the nanowire transistor (e.g. in a vertical stack), and the vertical nanowire for the resistive memory cell 908 and the nanowire transistor is the same vertical nanowire structure (i.e. the resistive memory cell and the nanowire transistor share one common continuous vertical nanowire).

The integrated resistive memory arrangement 900 may further include a passivation layer (e.g. insulation oxide) 912 at least substantially surrounding the nanowire 902, the RRAM cell 908 and the logic circuit 909.

The integrated resistive memory arrangement 900 may further include a first contact (e.g. a contact pad) 920 and a second contact (e.g. a contact pad) 922, for example made of metal, which may be electrically coupled to the nanowire 902, for example electrically coupled to the top of the nanowire 902. The first contact 920 may be electrically coupled to a bit line (BL) and the second contact 922 may be electrically coupled to a drain terminal of the GAA nanowire transistor.

The integrated resistive memory cell 900 may further include a third contact (e.g. a contact pad) 924 and a fourth contact (e.g. a contact pad) 926, for example made of metal, which may be formed on or over the passivation layer 912, and extending through one or more through vias (e.g. 928) and electrically coupled to the logic circuit 909. The third contact 924 and the fourth contact 926 may be respectively electrically coupled to a source terminal and a gate terminal of the GAA nanowire transistor.

Referring to the top view of the integrated resistive memory cell 900, the first contact (e.g. D/BL contact) 920 and the second contact (e.g. D/BL contact) 922 are illustrated as overlapping together. It should be appreciated that they may be arranged in parallel vertically and not on the same plane. The reference numeral 901a represents a source line, the reference numeral 901b represents a word line while the reference numeral 901c represents the overlapped D and BLs. In addition, it should be appreciated that the drain (D) terminal may not be required, for example similar to the embodiment of FIG. 7B, where the RRAM cells may fully cover the top of nanowires.

Therefore, vertical GAA nanowire transistors may be integrated with the resistive memory arrangements of various embodiments vertically on the same nanowires, where one electrode of a RRAM cell may share the same nanowire (e.g. silicon nanowire) with the drain region (D) of a MOSFET, for embedded memory applications.

Figure 10:
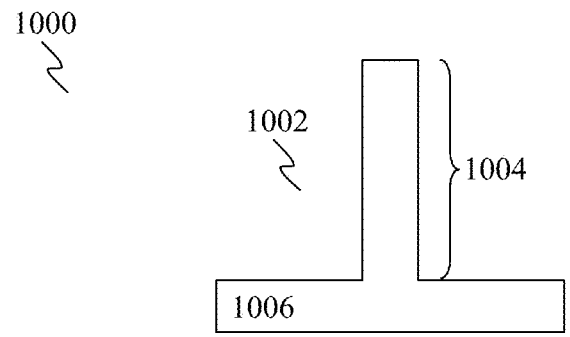
FIG. 10 shows a schematic cross sectional view of a fabrication process for forming a resistive memory arrangement, according to various embodiments.
Figure 10:
Figure 10:
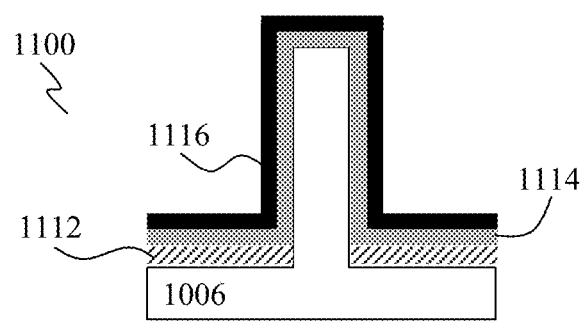
Figure 10:
Figure 10:
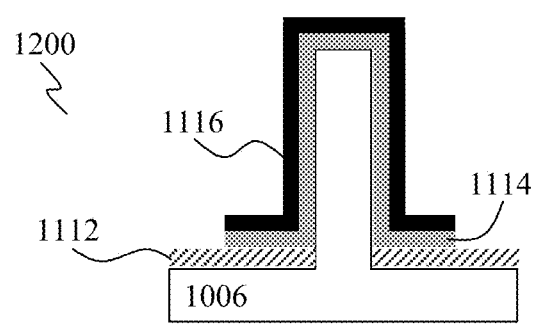

FIG. 10 shows a schematic cross sectional view of a fabrication process 1000 for forming a resistive memory arrangement, according to various embodiments. A substrate may be provided. The substrate may be patterned and portions of the substrate may be removed, for example by etching, to define a nanowire. As a result, a structure 1002 may be obtained, the structure 1002 having a nanowire 1004 extending monolithically from the substrate 1006.

A passivation layer (e.g. insulation oxide) may be deposited over the structure 1002. The passivation may be patterned and part of the passivation layer may be removed to leave a passivation layer towards the bottom or base region of the nanowire 1004 on the substrate 1006. A resistive layer, followed by a conductive layer may then be deposited. As a result, a structure 1100 may be obtained, having a passivation layer 1112, a resistive layer 1114 and a conductive layer 1116.

The resistive layer 1114 and the conductive layer 1116 may be patterned and portions of the resistive layer 1114 and the conductive layer 1116 may then be removed, for example on the end sides of the resistive layer 1114 and the conductive layer 1116. As a result, a structure 1200 may be obtained.

Further processing of the structure 1200 may be further carried out, where necessary. Doping processes may also be carried out. In addition, it should be appreciated that other layers, for example a second conductive layer, a peripheral layer, etc. may be deposited and processes (e.g. etched) at any stage of the fabrication process 1000. Therefore, the fabrication process 1000 begins with formation of a nanowire followed by deposition of the layers. The layers may be to form a resistive memory cell, or a resistive memory cell and a diode.

Various embodiments may provide one or more of the following advantages:

(1) The lateral 1D+1RRAM stack of various embodiments not only minimizes the interference from neighbouring cells, but also increases the current by increasing the diode area, without penalty on the 1D+1RRAM unit area.

(2) Silicon (Si) based diodes offer the highest performance, but the high fabrication temperature is still problematic, especially over metal layers (e.g. NiSi or Cu). The lateral 1D+1RRAM stack of various embodiments makes it possible to fabricate high performance Si-based diode without any damage to the pre-existing structures.

(3) The lateral self-rectifying RRAM stack of various embodiments may be implemented directly without an increase of unit cell size. In contrast, conventional devices may employ additional transistors to suppress the interference from neighbouring cells, thereby increasing the device area.

(4) The GAA architecture of various embodiments may provide more flexibility to control the areas of 1D and 1RRAM separately.

(5) The lateral 1D+1RRAM stack of various embodiments provides a higher potential for high density, and also adds flexibility to control the areas of 1D and 1RRAM separately.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A resistive memory arrangement comprising:
a nanowire having a longitudinal axis; and
a resistive memory cell comprising:
a resistive layer comprising a resistive changing material, wherein at least a section of the resistive layer is arranged covering at least a portion of a surface of the nanowire, and wherein at least a portion of the resistive layer is arranged around the longitudinal axis and at least substantially surrounding the nanowire; and
a conductive layer arranged on at least a part of the resistive layer, wherein at least a portion of the conductive layer is arranged at least substantially surrounding the portion of the resistive layer;

wherein the nanowire and the conductive layer act as separate electrical contacts to allow a current flow between the nanowire and the conductive layer through the resistive layer.

2. The resistive memory arrangement as claimed in claim 1, wherein the portion of the resistive layer is arranged at least substantially surrounding a partial portion of the nanowire.

3. The resistive memory arrangement as claimed in claim 1, wherein the nanowire comprises a semiconductor material.

4. The resistive memory arrangement as claimed in claim 1, wherein the nanowire has a diameter of between about 10 nm and about 200 nm.

5. The resistive memory arrangement as claimed in claim 1, wherein the nanowire has a length of between about 100 nm and about 2 μm.

* * * * *